(12) United States Patent
Lin et al.

(10) Patent No.: US 11,848,381 B2
(45) Date of Patent: Dec. 19, 2023

(54) METHODS OF OPERATING MULTI-BIT MEMORY STORAGE DEVICE

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu (TW); Han-Jong Chia, Hsinchu (TW); Martin Liu, Hsinchu (TW); Sai-Hooi Yeong, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/871,315

(22) Filed: Jul. 22, 2022

(65) Prior Publication Data

US 2022/0359761 A1 Nov. 10, 2022

Related U.S. Application Data

(62) Division of application No. 17/185,549, filed on Feb. 25, 2021, now Pat. No. 11,532,746.

(Continued)

(51) Int. Cl.
*G11C 11/22* (2006.01)
*H01L 29/78* (2006.01)
(Continued)

(52) U.S. Cl.
CPC ...... *H01L 29/78391* (2014.09); *G11C 11/223* (2013.01); *G11C 11/2273* (2013.01);
(Continued)

(58) Field of Classification Search
CPC .......... H01L 29/78391; H01L 29/6684; H10B 51/30; G11C 11/223; G11C 11/2273; G11C 11/2275
(Continued)

(56) References Cited

U.S. PATENT DOCUMENTS

| 6,888,736 B2 * | 5/2005 | Dimmler | ................ H10B 53/00 257/E29.272 |
| 3,164,941 A1 | 4/2012 | Kang et al. | |

(Continued)

FOREIGN PATENT DOCUMENTS

| KR | 20060051154 | 5/2006 |
| KR | 20080061236 | 7/2008 |
| KR | 20190105174 | 9/2019 |

OTHER PUBLICATIONS

Office Action dated Jul. 4, 2022 for corresponding case No. 10-2021-0048634. (pp. 1-9).

*Primary Examiner* — Viet Q Nguyen
(74) *Attorney, Agent, or Firm* — Hauptman Ham, LLP

(57) ABSTRACT

A method (of reading a ferroelectric field-effect transistor (FeFET) configured as a 2-bit storage device that stores two bits, wherein the FeFET includes a first source/drain (S/D) terminal, a second S/D terminal, a gate terminal and a ferroelectric layer, a second bit being at a first end of the ferroelectric layer, the first end being proximal to the first S/D terminal) includes reading the second bit including: applying a gate sub-threshold voltage to the gate terminal; applying a read voltage to the second S/D terminal; applying a do-not-disturb voltage to the first S/D terminal; and sensing a first current at the second S/D terminal; and wherein the read voltage is lower than the do-not-disturb voltage.

20 Claims, 7 Drawing Sheets

Related U.S. Application Data

(60) Provisional application No. 63/032,082, filed on May 29, 2020.

(51) Int. Cl.
*H01L 29/66* (2006.01)
*H10B 51/30* (2023.01)

(52) U.S. Cl.
CPC ...... *G11C 11/2275* (2013.01); *H01L 29/6684* (2013.01); *H10B 51/30* (2023.02)

(58) Field of Classification Search
USPC .......................................................... 365/145
See application file for complete search history.

(56) References Cited

U.S. PATENT DOCUMENTS

| | | | | |
|---|---|---|---|---|
| 8,164,941 B2* | 4/2012 | Kang | ...................... | G11C 11/22 365/145 |
| 9,830,969 B2* | 11/2017 | Slesazeck | .............. | H10B 53/30 |
| 10,056,393 B2* | 8/2018 | Schröder | .............. | H01L 29/516 |
| 10,403,721 B2 | 9/2019 | Liu et al. | | |
| 10,460,788 B2 | 10/2019 | Muller | | |
| 10,714,500 B2 | 7/2020 | Heo et al. | | |
| 10,854,707 B2 | 12/2020 | Yoo et al. | | |
| 11,380,700 B2* | 7/2022 | Kim | ..................... | H01L 27/0629 |
| 11,430,510 B2* | 8/2022 | Gong | ................... | G11C 11/2275 |
| 11,450,370 B2* | 9/2022 | Yuh | ..................... | G11C 11/2275 |
| 11,532,746 B2* | 12/2022 | Lin | .................... | H01L 29/40111 |
| 2004/0057274 A1 | 3/2004 | Dimmler et al. | | |
| 2004/0057319 A1* | 3/2004 | Dimmler | ............. | G11C 11/5657 257/E29.272 |
| 2006/0081901 A1 | 4/2006 | Arimoto et al. | | |
| 2007/0126042 A1 | 6/2007 | Kijima et al. | | |
| 2008/0158934 A1 | 7/2008 | Kang et al. | | |
| 2010/0110753 A1* | 5/2010 | Slesazeck | .............. | H10B 51/30 365/182 |
| 2011/0090731 A1 | 4/2011 | Chi et al. | | |
| 2012/0181538 A1 | 7/2012 | Kamura et al. | | |
| 2017/0040331 A1 | 2/2017 | Van Houdt et al. | | |
| 2017/0162250 A1* | 6/2017 | Slesazeck | ........... | G11C 11/2273 |
| 2018/0366476 A1 | 12/2018 | Liu | | |
| 2019/0259778 A1 | 8/2019 | Yoo | | |

\* cited by examiner

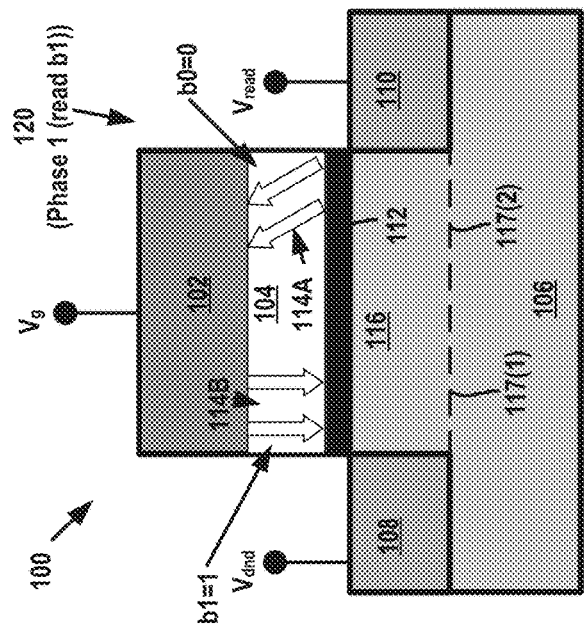
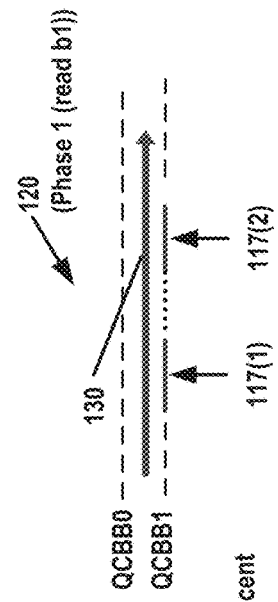
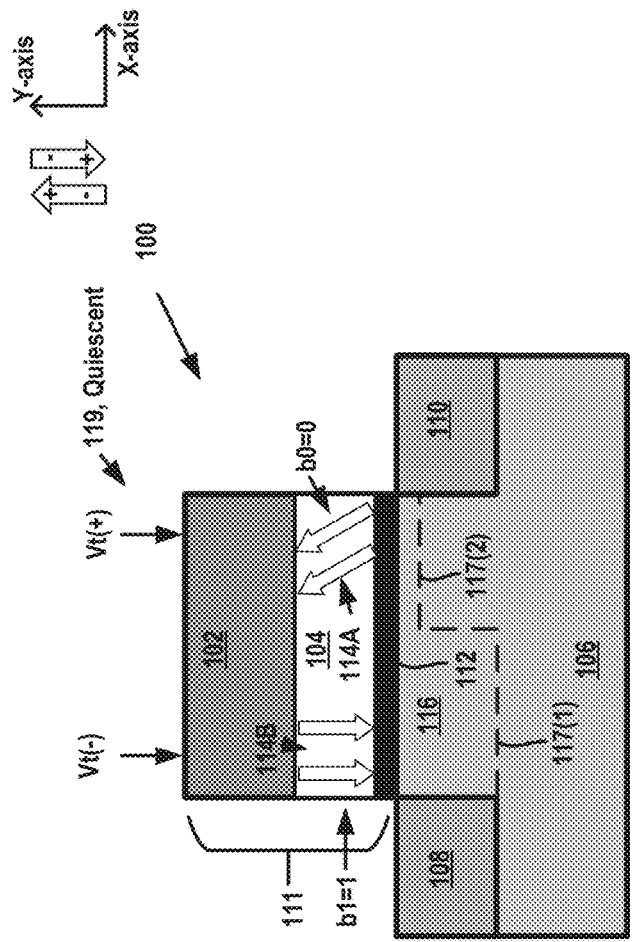
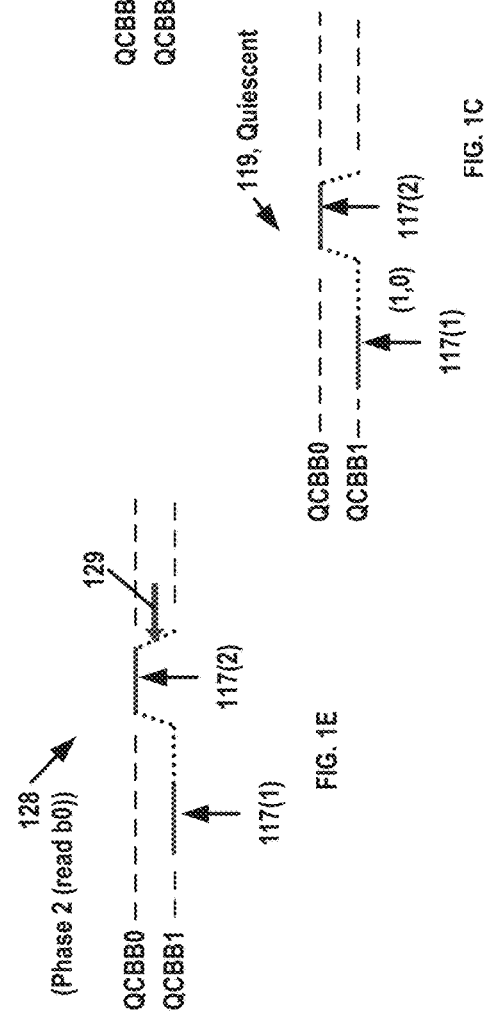
FIG. 1A
FIG. 1B
FIG. 1C
FIG. 1D
FIG. 1E

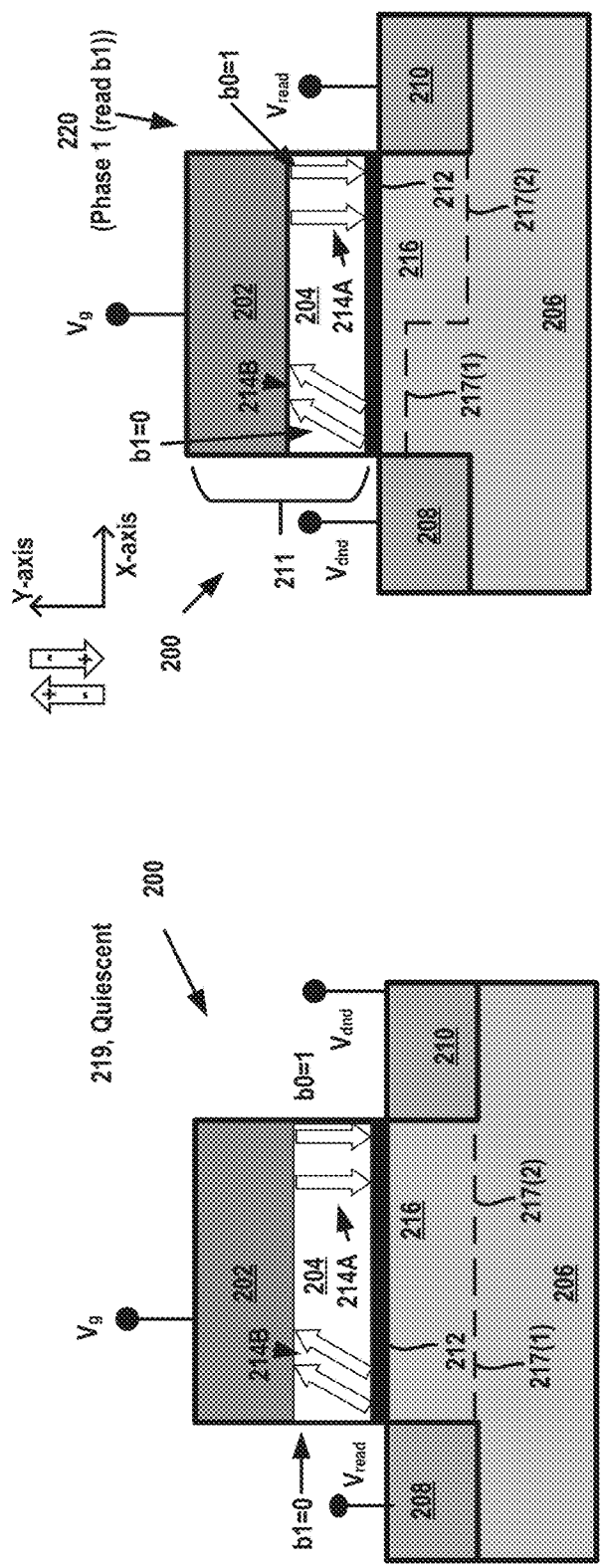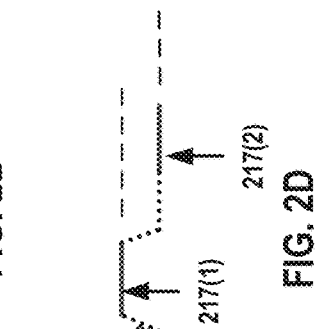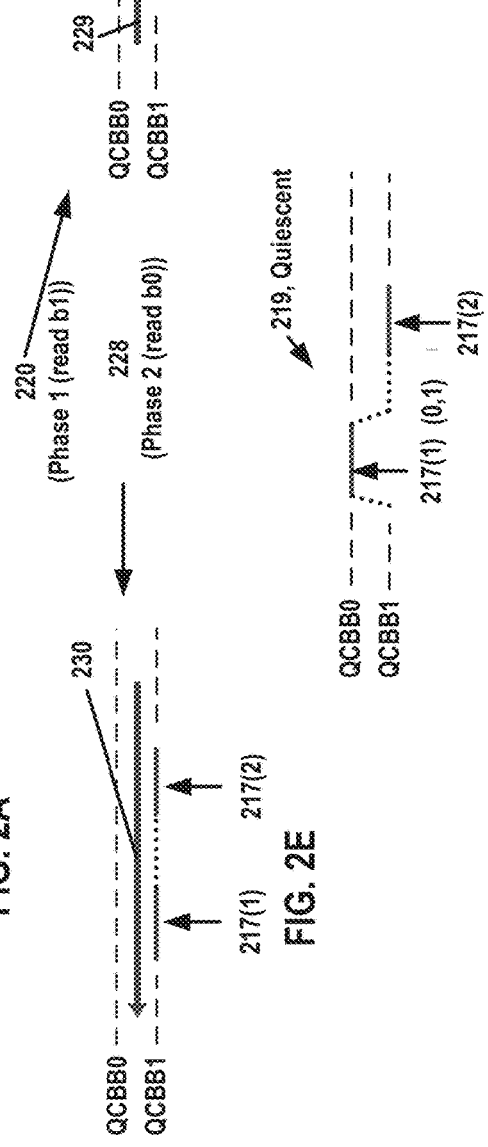

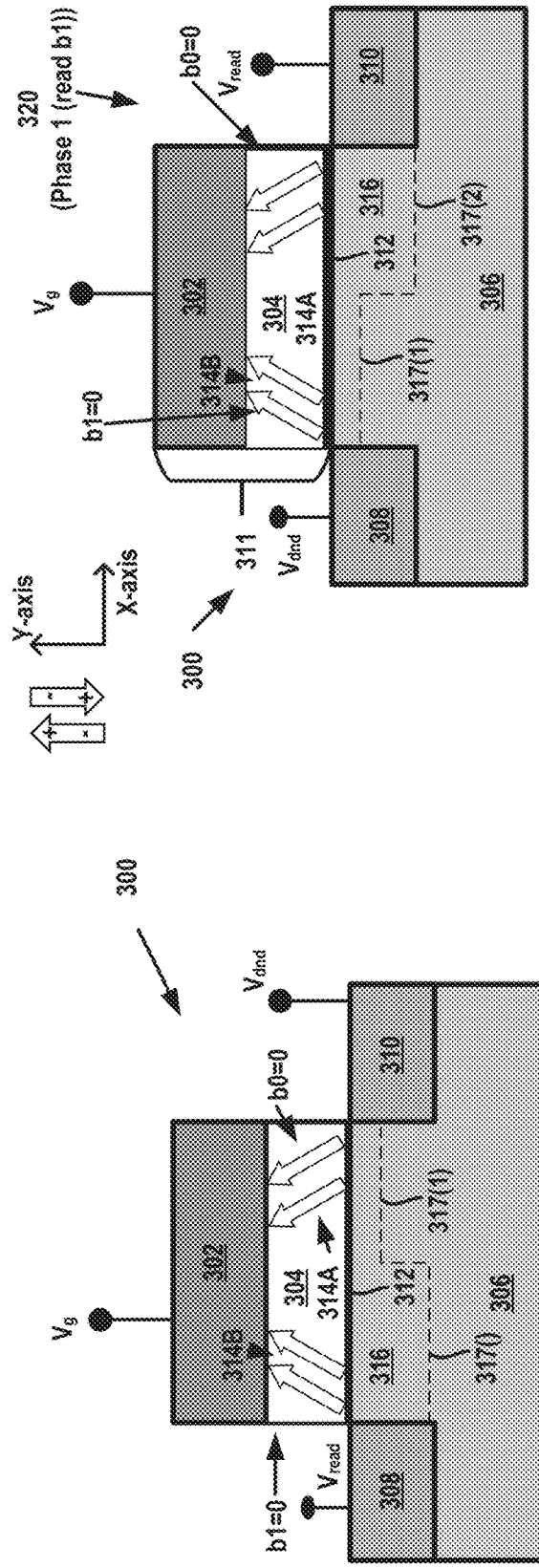
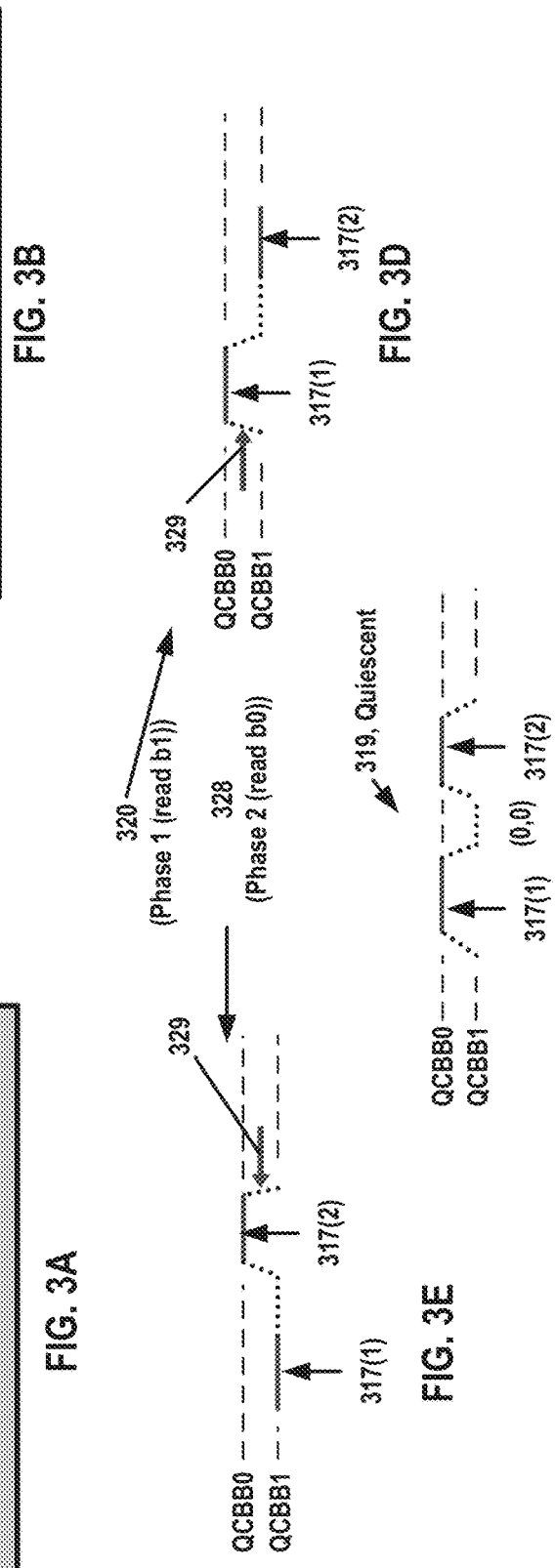

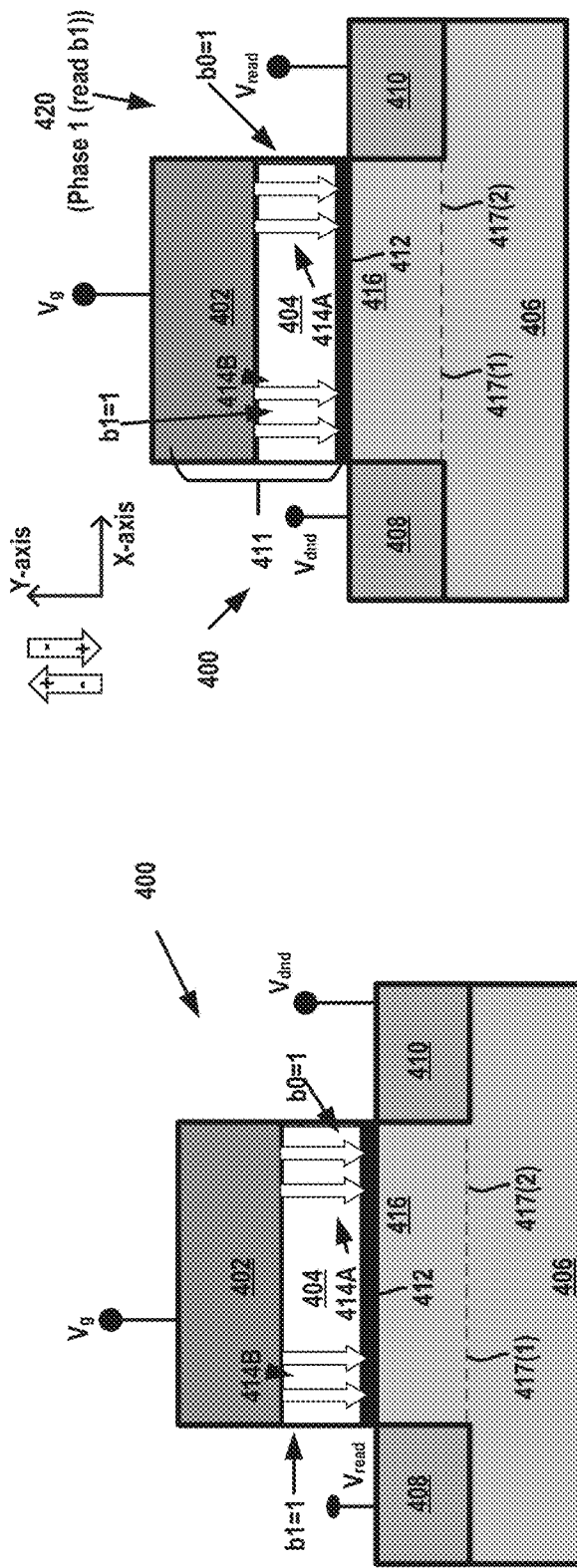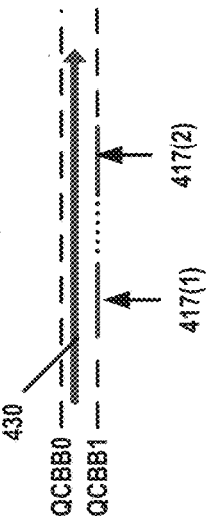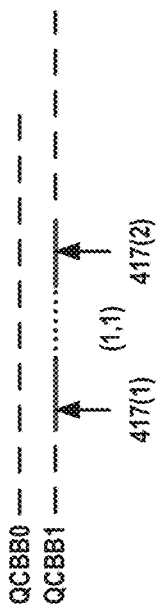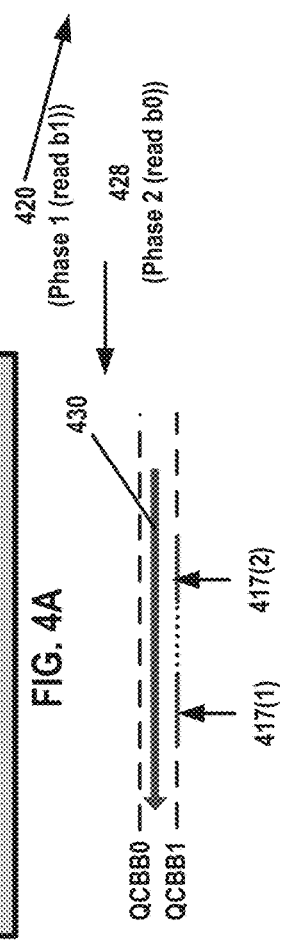

METHODS OF OPERATING MULTI-BIT MEMORY STORAGE DEVICE

PRIORITY CLAIM AND CROSS-REFERENCE

This application is a divisional application of U.S. patent application Ser. No. 17/185,549, filed on Feb. 25, 2021, now U.S. Pat. No. 11,532,746, granted Dec. 20, 2022, and claims the benefit of U.S. Provisional Patent Application No. 63/032,082, filed May 29, 2020, which is incorporated by reference herein in its entirety.

BACKGROUND

The memory cell is the fundamental building block of memory. It can be implemented using different technologies, such as bipolar, metal oxide semiconductor (MOS), and other semiconductor devices. It can also be built from magnetic material such as ferrite cores or magnetic bubbles. Regardless of the implementation technology used, the purpose of the binary memory cell is the same, namely storing one bit of binary information. In some approaches, the memory cell is set to store a 1 and reset to store a zero.

A ferroelectric field-effect transistor (FeFET) is a type of field-effect transistor (FET) that includes a layer of ferroelectric material sandwiched between the gate electrode and source-drain conduction region of the device. FeFET based devices are used in FeFET memory—a type of single transistor binary non-volatile memory.

BRIEF DESCRIPTION OF THE DRAWINGS

Aspects of the present disclosure are best understood from the following detailed description when read with the accompanying FIGS. It is noted that, in accordance with the standard practice in the industry, various features are not drawn to scale. In fact, the dimensions of the various features may be arbitrarily increased or reduced for clarity of discussion.

FIGS. 1A-1B are corresponding cross-sections of a 2-bit ferroelectric field effect transistor (FeFET), in accordance with some embodiments.

FIGS. 1C-1E are corresponding waveforms that represent channel band barrier portions under correspondingly different conditions, in accordance with some embodiments.

FIGS. 2A-2B are corresponding cross-sections of a 2-bit FeFET, in accordance with some embodiments.

FIGS. 2C-2E are corresponding waveforms that represent channel band barrier portions under correspondingly different conditions, in accordance with some embodiments.

FIGS. 3A-3B are corresponding cross-sections of a 2-bit FeFET, in accordance with some embodiments.

FIGS. 3C-3E are corresponding waveforms that represent channel band barrier portions under correspondingly different conditions, in accordance with some embodiments.

FIGS. 4A-4B are corresponding cross-sections of a 2-bit FeFET, in accordance with some embodiments.

FIGS. 4C-4E are corresponding waveforms that represent channel band barrier portions under correspondingly different conditions, in accordance with some embodiments.

DETAILED DESCRIPTION

Figure 5A:
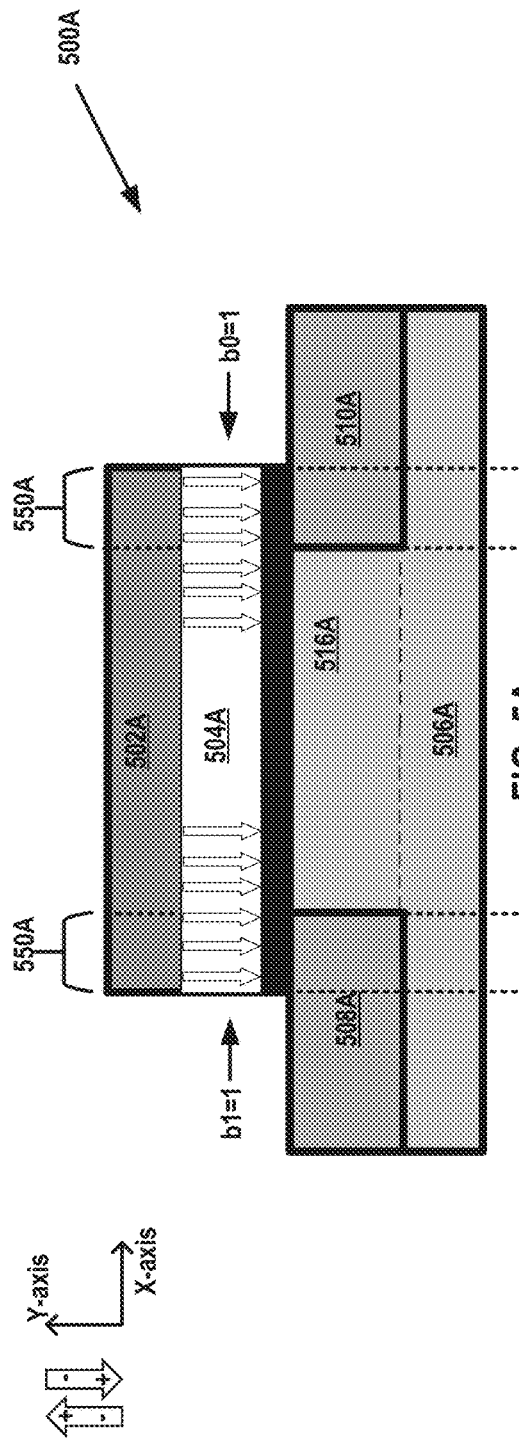
FIGS. 5A-5B are corresponding cross-sections of corresponding 2-bit FeFETs, in accordance with some embodiments.

Without being bound by theory, explanations of underlying physics are provided herein. The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

In some embodiments, a ferroelectric field-effect transistor (FeFET) is configured as a 2-bit memory device which stores different data states of bits (b1,b0). The FeFET includes a ferroelectric layer between a gate region and a substrate material. At opposite ends of the ferroelectric layer, and within the substrate material, are a first source-drain (S/D) region and a second source-drain (S/D) region. In some embodiments, when representing the data states of (b1,b0)=(0,1) or (b1,b0)=(1,0), dipoles at the first and second ends of the ferroelectric layer have substantially opposite polarizations. In some embodiments, each of the data states (b1,b0)=(0,1) and (b1,b0)=(1,0) is described as an asymmetric data state, and so the corresponding configurations of the FeFET are described in terms of the FeFET having corresponding asymmetric polarization states of the ferroelectric layer.

FIGS. 1A and 1B are corresponding cross-sections of a 2-bit ferroelectric field effect transistor (FeFET) 100, in accordance with some embodiments.

In some embodiments, FeFET 100 includes a semiconductor substrate 106 which includes a first source/drain (S/D) region 108 and a second S/D region 110. A gate stack 111 is over semiconductor substrate 106 with first S/D region 108 and second S/D region 110 extending to opposite sides of gate stack 111. Gate stack 111 includes a ferroelectric layer 104 over semiconductor substrate 106 and a gate region 102 over ferroelectric layer 104. First and second ends of ferroelectric layer 104 are proximal correspondingly to first S/D region 108 and second S/D region 110.

Dipoles are dispersed throughout ferroelectric layer 104. In particular, ferroelectric layer 104 includes a first set of dipoles 114A at the second end of ferroelectric layer 104, and a second set of dipoles 114B at the first end of ferroelectric layer 104. The first set of dipoles 114A has a first polarization. The second set of dipoles 114B has a second polarization where the second polarization is substantially opposite the first polarization. Each dipole 114A and each dipole 114B is correspondingly represented in FIGS. 1A-2B by an arrow. As used herein, the arrow head of the dipole represents a positively charged end of the dipole and the tail represents a negatively charged end of the dipole. Accordingly, each dipole 114A and each dipole 114B correspondingly represents separation of positive and negative charges, and vice-versa, within ferroelectric layer 104. For simplicity of illustration, two dipoles 114A and two dipoles 114B are shown in FIGS. 1A-1B (and similarly other cross-sectional drawings disclosed herein); as a practical matter, a great many dipoles present in ferroelectric layer 104 and which have correspondingly the orientations of dipole 114A or 114B.

In FIG. 1A, regarding a first dipole which has the positively charged end pointing upward and the negatively charged end pointing downward, the following is assumed: the first dipole represents a first polarization state; the first dipole, e.g., dipole 114A, is shown as an arrow whose head is pointing upward and whose tail is pointing downward; and the first dipole represents a logical "0". Also in FIG. 1A, regarding a second dipole which has the negatively charged end pointing upward and the positively charged end pointing downward, the following is assumed: the second dipole represents a second polarization state; the second dipole, e.g., dipole 114B, is shown as an arrow whose tail is pointing upward and whose head is pointing downward; and the second dipole represents a logical "1." Accordingly, in FIG. 1A, relative to the X-axis, the polarization of ferroelectric layer 104 is asymmetric. More particularly, the polarization of ferroelectric layer 104 is asymmetric because the first end of ferroelectric layer 104 (which is proximal to first S/D region 108) has the second polarization and the second end of ferroelectric layer 104 (which is proximal second S/D region 110) has the first polarization.

In one or more embodiments, an invertible region 116 extends through semiconductor substrate 106 between first S/D 108 and second S/D region 110. In some embodiments, semiconductor substrate has N-type doping such that the charge carriers are electrons (−) and FeFET 100 is an N-type FeFET. In some embodiments, N-type FeFET 100 is described as an N-type Metal Oxide Semiconductor FET (MOSFET) which further includes a ferroelectric layer (e.g., ferroelectric layer 104) inserted between the gate electrode (e.g., gate region 102) and the invertible region (e.g., invertible region 116). In some embodiments, semiconductor substrate has P-type doping such that the charge carriers are holes (+) and FeFET 100 is a P-type FeFET. In some embodiments, FeFET 100 includes a metal ferroelectric insulator semiconductor (MFIS), a single cell transistor capable of holding an electrical field polarization to retain one or more steady states in the absence of any electrical bias or the like.

If ferroelectric layer 104 were not present, and in the absence of a voltage on gate region 102, invertible region 116 would represent a depletion region that does not support the flow of charge carriers. If ferroelectric layer 104 was not present, in the presence of a sufficient voltage on gate region 102, i.e., a voltage greater than the threshold voltage, Vt, invertible region 116 would be inverted and would support the flow of charge carriers and so would represent a channel extending from first S/D region 108 to second S/D region 110.

If both overlying portions of ferroelectric layer 104 have the first polarization state (not shown in FIG. 1A, but see FIGS. 3A-3B), and in the absence of voltages correspondingly on gate region 102, first S/D region 108 and second S/D region 110, then the corresponding portions of invertible region 116 correspondingly are depletion regions that do not support the flow of charge carriers. However, if both overlying portions of ferroelectric layer 104 have the second polarization state (not shown in FIG. 1A, but see FIGS. 4A-4B), and in the absence of voltages correspondingly on gate region 102, first S/D region 108 and second S/D region 110, then the corresponding portions of invertible region 116 do support the flow of charge carriers.

In FIG. 1A, a first portion of invertible region 116 is proximal to the first end of ferroelectric layer 104 and to first S/D region 108, and a second portion of invertible region 116 is proximal to the second end of ferroelectric layer 104 and to second S/D region 110. In FIGS. 1A-1B, a channel band barrier (CBB) portion 117(1) is different than CBB portion 117(2) for the second portion of invertible region 116. In some embodiments, the CBB represents the bottom edge of the depletion region within invertible region 116, wherein the bottom edge of the depletion region is distal from ferroelectric layer 104 and the top edge of the depletion region is proximal to ferroelectric layer 104.

In one or more embodiments, FeFET 100 is configured to store one of four possible 2-bit data states, namely (0,1), (1,0), (1,1) or (0,0). In some embodiments, a bit represented by the polarization of the second end of ferroelectric layer 104 proximal to S/D region 110 is referred to as the first bit or bit zero (b0) of the 2-bit memory structure which FeFET 100 represents, and a bit represented by the polarization of the first end of ferroelectric layer 104 proximal to S/D region 108 is referred to as the second bit or bit one (b1) of the 2-bit memory structure FeFET 100. Accordingly, the two bits are representable as (b1,b0), where (b1,b0) is one of (0,1), (1,0), (1,1) or (0,0).

In some embodiments, ferroelectric layer 104 is separated from substrate 106 by dielectric material 112. In some embodiments, dielectric material 106 includes an oxide, a nitride, a carbide, or the like. In some embodiments, gate region 102 includes a conductive material, such as polysilicon, aluminum, copper, or the like. In various embodiments, ferroelectric layer 104 includes silicon doped hafnium oxide (Si-doped HfO2), lead titanate, lead zirconate titanate (PZT), lead lanthanum zirconate titanate, strontium bismuth tantalate (SBT), bismuth lanthanum titanate (BLT), bismuth neodymium titanate (BNT), or the like.

In FIGS. 1A-1B, relative to the X-axis, gate region 102 is shown between first and second S/D regions 108, 110. In some embodiments (see FIG. 5A), gate region 102 and ferroelectric layer 104 partially overlap first S/D region 108 and/or second S/D region 110. In some embodiments (see FIG. 5B), gate region 102 and ferroelectric layer 104 cover substantially all of first S/D region 108 and/or second S/D region 110. In some embodiments, first and second SD regions 108, 110 include a conductive material, such as doped polysilicon, a metal, or the like. In some embodiments, first S/D region 108 and second S/D region 110 have a first doping type that is opposite a second doping type of the substrate 106. In some embodiments, first S/D region 108 has a different doping concentration and/or shape than the second S/D region 110. For example, in some embodiments, first S/D region 108 has a lower doping concentration than second S/D region 110. In some embodiments, the lower doping concentration of first and second S/D regions 108, 110 mitigates gate induced drain leakage (GIDL) current in FeFETs. In some embodiments, substrate 106 is an opposite dopant type relative to a dopant type of first and second S/D regions 108, 110. For example, if first and second S/D regions 108, 110 are n-type, then substrate 106 is p-type, and vice-versa.

In general, subjecting ferroelectric layer 104 to an electric field of sufficient magnitude orients dipoles in ferroelectric layer 104 into a corresponding one of two possible polarization states (bistable states), e.g., dipole 114A and dipole 114B. The corresponding field-induced polarization state remains after the field is removed, i.e., each of the bistable polarization states is nonvolatile. In terms of the FeFET as a whole, the two possible polarization states of the layer of ferroelectric material manifest as two corresponding possible states of the FeFET, namely an erased state and a programmed state.

In FIG. 1A: bit b1 of the 2-bits of data stored by FeFET 100 is shown as being a logical "1" and so is represented by the first end of ferroelectric layer 104 (which, again, is proximal to S/D region 108) having the second polarization as represented by dipoles 114B; and bit b0 of the 2-bits of data stored by FeFET 100 is shown as being a logical "0" and so is represented by the second end of ferroelectric layer 104 (which, again, is proximal to S/D region 110) having the first polarization as represented by dipoles 114A.

In some embodiments, setting a bit to a logical 1 value ("1"), i.e., programming the bit, in FeFET 100 is performed by applying an appropriate value of a gate voltage (Vg) and applying a corresponding appropriate value of a source/drain voltage (Vs/d) to the selected one of S/D region 108 and 110 that is to be set to a 1 value. For example, Vs/d is applied to the first S/D region 108 and/or the second S/D region 110 based upon which one of the four 2-bit data states is to be stored on FeFET 100, where the 2-bits (b1,b0) have the state (0,1), (1,0), (1,1) or (0,0). In some embodiments, both of bits b1 and b0 are set to "1", i.e., programmed, in FeFET 100 using Vg=3V and using Vs/d=0V for each of first S/D region 108 and second S/D region 110. In some embodiments, to program one of bits b1 and b0, e.g., bit b0, Vg is set to =3V, second S/D region 110 is Vs/d=0V at second S/D region 110, while first S/D region 108 is left floating or receives 1V.

In some embodiments, both of bits b1 and b0 are set to "0", i.e., erased, in FeFET 100 using Vg=−2V and using Vs/d=1V for each of first S/D region 108 and second S/D region 110. In some embodiments, to erase one of bits b1 and b0, e.g., bit b0, Vg is set to =−2V, second S/D region 110 is Vs/d=1V at second S/D region 110, while first S/D region 108 is left floating or receives 0V.

In general, to change the polarization state of a portion of a ferroelectric layer, the portion of the ferroelectric layer is subjected to an electric field of sufficient magnitude to orient the dipoles of the portion of the ferroelectric layer which are in the path of the electric field according to the direction of the electric field. In some embodiments, an electric field of sufficient magnitude to orient the dipoles of the ferroelectric layer is referred to as a coercive field (Ec). In some embodiments, and in the context of FeFET 100, a voltage difference between Vg and Vs/d which is of sufficient magnitude to induce Ec is referred to as a coercive voltage (Vc). In some embodiments, Vc is at least about 3V.

More particularly, to manipulate the polarization of dipoles 114A so that bit b0 represents a logical "1," a combination of voltage values for Vg and Vs/d (applied to second S/D region 110) (Vsd_110) is applied wherein the resulting difference is equal to or greater than Vc. In some embodiments, to change the polarization of dipoles 114A so as to represent a logical "0," a combination of Vg=−2V and Vsd_110=1V is used. In a circumstance in which second S/D region 110 has a higher positive potential than gate region 102, (e.g., Vg=−2V and Vsd_110=1V), dipoles 114A become orientated with the negative ends proximal to second S/D region 110 and the positive ends proximal to gate region 102, resulting in the negative ends being proximal to invertible region 116. To avoid altering the state of bit b1 which is represented by the polarization of dipoles 114B, e.g., while the polarization of dipoles 114A is being manipulated, a voltage value of Vs/d that is applied to first S/D region 108 (Vsd_108) is selected so that a combination of voltage values for Vg and Vsd_108 results in a voltage difference that is less than Vc and thus dipoles 114B at first S/D region 108 are not altered from their previous state. In some embodiments, to avoid altering the state of bit b1 while the polarization of dipoles 114A is being manipulated (in part by setting Vg=−2V), first S/D region 108 is left floating. In some embodiments, to avoid altering the state of bit b1 while the polarization of dipoles 114A is being manipulated (in part by setting Vg=−2V), Vsd_108=0V. In some embodiments, to avoid altering the state of bit b1 while the polarization of dipoles 114A is being manipulated (in part by setting Vg=−2V), Vsd_108=VSS.

In FIG. 1A, the polarization of the second end of ferroelectric layer 104, which is proximal to second S/D region 110, thickens the depletion region proximal to second S/D region 110 relative to the Y-axis, and correspondingly raises/increases CBB portion 117(2) proximal to second S/D region 110. This raising/increasing of CBB portion 117(2) is discussed in more detail below.

FIG. 1B is a version of FIG. 1A which shows voltages applied during a phase 1 of a two-phase process by which bit b1 of the 2-bits of data stored by FeFET 100 is read. The two-phase read-process for reading the 2-bit state stored in FeFET 100 is discussed in more detail in the context of FIGS. 1C-1E.

In FIG. 1B, the voltages for phase 1 of the two-phase read operation are shown. During phase 1 (see also FIG. 1D), the voltages are configured to read bit b1 of the 2-bit data stored by FeFET 100, wherein bit b1 is stored at the first end of ferroelectric layer 104 which is proximal to first S/D region 108. More particularly, a bias voltage (Vbias) is applied to gate region 102, a read voltage (Vread) is applied to second S/D region 110 and a non-disturbing voltage (Vdnd) is applied to first S/D region 108.

FIGS. 1C-1E are corresponding waveforms 119, 120 and 128 that represent channel band barrier portions 117(1) and 117(2) under correspondingly different conditions, in accordance with some embodiments.

In FIG. 1C, waveform 119 represents channel band barrier (CBB) portions 117(1) and 117(2) for FeFET 100 during quiescent conditions. In some embodiments, during quiescent conditions for FeFET 100, each of gate region 102, first S/D region 108 and second S/D region 110 is left floating.

In waveform 119, CBB portion 117(2) has a first quiescent CBB value which corresponds to the first polarization state and so corresponds to a logical zero. Hereinafter, the first quiescent CBB value is referred to as QCBB0. In waveform 119, CBB portion 117(1) has a second quiescent CBB value which corresponds to the second polarization state and so corresponds to a logical one. Hereinafter, the second quiescent CBB value is referred to as QCBB1.

In FIG. 1D, waveform 120 represents CBB portions 117(1) and 117(2) during phase 1 of the two-phase read operation (see FIG. 1B). During phase 1, bit b1 is read, wherein bit b1 is stored at the first end of ferroelectric layer 104, the first end being proximal to first S/D region 108. During phase 1, Vg=Vbias is applied to gate region 102, Vdnd is applied to first S/D region 108 and Vread is applied to second S/D region 110.

In FIG. 1E, waveform 128 represents CBB portions 117(1) and 117(2) during phase 2 of the two-phase read operation. During phase 2, bit b0 is read, wherein bit b0 is stored at the second end of ferroelectric layer 104, the second end being proximal to second S/D region 110. During phase 2, Vg=Vbias is applied to gate region 102, Vdnd is applied to second S/D region 110 and Vread is applied to first S/D region 108.

Regarding FIGS. 1D-1E, in effect, relative to the side of FeFET 100 for which the stored bit value is being read (read-side), Vread is applied to the opposite side of FeFET 100 (non-read-side), which might seem counterintuitive at first. However, the values for Vread and Vg=Vbias are configured to ensure that the portion of invertible region 116 on the non-read-side of FeFET 100 is manipulated to support temporarily a flow of charge carriers. In some embodiments, the temporary duration of the support corresponds to the period of time in which the values for Vread and Vg=Vbias are applied which ensure that the portion of invertible region 116 on the non-read-side of FeFET 100 supports a flow of charge carriers. By manipulating the non-read-side of FeFET 100 to support temporarily a flow of charge carriers, whether or not a current flows between S/D regions 108 and 110 is then controlled by whether or not the portion of invertible region 116 on the read-side of FeFET 100 supports the flow of charge carriers.

Recalling the particular circumstances in which the second end of ferroelectric layer 104 has the first polarization representing a logical 0 value, the portion of invertible region 116 under the second end of ferroelectric layer 104 has CBB portion 117(2), and that CBB portion 117(2) accordingly has QCBB0, a value for Vg=Vbias is selected to be less than Vt for the particular circumstances. However, for the particular circumstances, the combination of Vg=Vbias and Vread is greater than Vt. Accordingly, in some embodiments, because Vg=Vbias is less than Vt for the particular circumstances, Vg=Vbias is described as sub-threshold voltage.

In general, assuming the non-read-side is being manipulated to support temporarily a flow of charge carriers, if the read-side of FeFET 100 stores a logical zero because the read-side of ferroelectric layer 104 is in the first polarization state, then the portion of invertible region 116 on the read-side of FeFET 100 does not support the flow of charge carriers, resulting in substantially no current flowing between S/D regions 108 and 110, which is interpreted as the read-side bit of FeFET 100 storing a logical zero.

Also, in general, assuming the non-read-side is being manipulated to support temporarily a flow of charge carriers, if the read-side of FeFET 100 stores a logical one because the read-side of ferroelectric layer 104 is in the second polarization state (as shown in FIG. 1B), then the portion of invertible region 116 on the read-side of FeFET 100 does support the flow of charge carriers, resulting in a significant flow of current between S/D regions 108 and 110, which is interpreted as the read-side bit of FeFET 100 storing a logical one. In some embodiments, a significant flow current is a current flow that would not be regarded as merely a leakage current.

Regarding FIG. 1D, it shows (again) phase 1 by which bit b1 is read. Recalling that bit b1=1 (see FIG. 1A) because the first end of ferroelectric layer 104 has the second polarization and that bit b0=0 (see FIG. 1A) because the second end of ferroelectric layer 104 has the first polarization, FIG. 1D assumes that Vg=Vbias is being applied to gate region 102, Vdnd=0V is being applied to first S/D region 108 and Vread=−1V is being applied to second S/D region 110.

In the context of FIG. 1D, the voltage difference between Vg=Vbias and Vread (the latter being applied to second S/D region 110) in combination with the first polarization state of the second end of ferroelectric layer 104 is sufficient to overcome the first polarization at the second end of ferroelectric layer 104 and consequently is sufficient to draw charge carriers into the portion of invertible region 116 that is proximal to second S/D region 110, with a result that the portion of invertible region 116 which is proximal to first S/D region 108 supports temporarily a flow of charge carriers. Because of the second polarization at the first end of ferroelectric layer 104, the portion of invertible region 116 proximal to first S/D region 108 supports the flow of charge carriers under quiescent conditions. Accordingly, the portion of invertible region 116 proximal to first S/D region 108 also supports the flow of charge carriers when Vg=Vbias is being applied to gate region 102 and Vdnd=0V is being applied to first S/D region 108. As a temporary result, both the portion of invertible region 116 proximal to first S/D region 108 and the portion of invertible region 116 proximal to second S/D region 110 support the flow of charge carriers, and consequently current flows from first S/D region 108 to second S/D region 110 as indicated by reference number 130 in FIG. 1D, which is interpreted as the bit b1 of FeFET 100 storing a logical one.

Regarding FIG. 1E, it shows (again) phase 2 by which bit b0 of FeFET 100 is read. Recalling that bit b1=1 (see FIG. 1A) because the first end of ferroelectric layer 104 has the second polarization and that bit b0=0 (see FIG. 1A) because the second end of ferroelectric layer 104 has the first polarization, FIG. 1E assumes that Vg=Vbias is being applied to gate region 102, Vread=−1V is being applied to first S/D region 108 and Vdnd=0V is being applied to second S/D region 110.

In the context of FIG. 1E, because of the second polarization at the first end of ferroelectric layer 104, the portion of invertible region 116 proximal to S/D region 108 supports the flow of charge carriers under quiescent conditions. Accordingly, the portion of invertible region 116 proximal to S/D region 108 also supports the flow of charge carriers when Vg=Vbias is being applied to gate region 102 and Vread=−1V is being applied to first S/D region 108. The voltage difference between Vg and Vdnd (the latter being applied to second S/D region 110) in combination with the second polarization state of the first end of ferroelectric layer 104 is not sufficient to overcome the first polarization at the second end of ferroelectric layer 104 and consequently is NOT sufficient to draw charge carriers into the portion of invertible region 116 that is proximal to second S/D region 110, with a result that the portion of invertible region 116 which is proximal to first S/D region 108 does NOT support a flow of charge carriers. As a further result, only the portion of invertible region 116 proximal to first S/D region 108 supports the flow of charge carriers, and consequently no current flows from first S/D region 108 to second S/D region 110 as indicated by reference number 129 in FIG. 1E, which is interpreted as the bit b0 of FeFET 100 storing a logical zero.

FIGS. 2A and 2B are corresponding cross-sections of a 2-bit FeFET 200, in accordance with some embodiments. FIGS. 2C-2E are corresponding waveforms 219, 220 and 228 that represent channel band barrier portions under correspondingly different conditions, in accordance with some embodiments.

FIGS. 2A-2E follow a similar numbering scheme to that of FIGS. 1A-1E. Though some aspects correspond, nevertheless there are some aspects that differ. To help identify aspects which correspond, the numbering convention uses 2-series numbers for FIGS. 2A-2E while FIGS. 1A-1E uses 1-series numbers. For example, item 219 in FIG. 2C is a waveform under quiescent conditions and corresponding item 119 in FIG. 1C is a waveform under quiescent conditions, and wherein: similarities are reflected in the common root_19; and differences are reflected in the corresponding leading digit 2 in FIG. 2C and 1 in FIG. 1C. For brevity, the discussion will focus more on differences between FIGS. 2A-2E and FIGS. 1A-1E than on similarities.

In some embodiments, FeFET 200 includes a semiconductor substrate 206 which includes a source region 208 and a drain region 210. A gate stack 211 is over semiconductor substrate 206 with source region 208 and drain region 210 (hereinafter referred to as first S/D region 208 and second S/D region 210) extending to opposite sides of gate stack 211. Gate stack 211 includes a ferroelectric layer 204 over semiconductor substrate 206 and a gate region 202 over ferroelectric layer 204. First and second ends of ferroelectric layer 204 are proximal correspondingly to first S/D region 208 and second S/D region 210. Dipoles are dispersed throughout ferroelectric layer 204. In particular, ferroelectric layer 204 includes a first set of dipoles 214A at the second end of ferroelectric layer 204, and a second set of dipoles 214B at the first end of ferroelectric layer 204. In one or more embodiments, an invertible region 216 extends through semiconductor substrate 206 between first S/D region 208 and second S/D region 210.

In FIGS. 2A-2B: bit b1 of the 2-bits of data stored by FeFET 200 is shown as being a logical "0" and so is represented by the first end of ferroelectric layer 204 (which, again, is proximal to first S/D region 208) having the first polarization; and bit b0 of the 2-bits of data stored by FeFET 200 is shown as being a logical "1" and so is represented by the second end of ferroelectric layer 204 (which, again, is proximal to second S/D region 210) having the second polarization. Accordingly, in FIGS. 2A-2B, relative to the X-axis, the polarization of ferroelectric layer 204 is asymmetric. More particularly, the polarization of ferroelectric layer 204 is asymmetric because the first end of ferroelectric layer 204 (which is proximal to first S/D region 208) has the first polarization and the second end of ferroelectric layer 104 (which is proximal second S/D region 210) has the second polarization.

In FIGS. 2A-2B, the polarization of the first end of ferroelectric layer 204, which is proximal to first S/D region 208, thickens the depletion region proximal to first S/D region 208 relative to the Y-axis, and correspondingly raises/increases CBB portion 217(1) proximal to first S/D region 208 (see FIG. 2C). This raising/increasing of CBB portion 217(1) is discussed in more detail below.

FIG. 2A shows voltages applied during phase 2 of the two-phase process by which bit b0 of the 2-bits of data stored by FeFET 200 is read. FIG. 2B is a version of FIG. 2A which shows voltages applied during phase 1 of the two-phase process by which bit b1 of the 2-bits of data stored by FeFET 200 is read. The two-phase read-process for reading the 2-bit state stored in FeFET 200 is discussed in more detail in the context of FIGS. 2D-2E.

In FIG. 2B, the voltages for phase 1 of the two-phase read operation are shown. More particularly, during phase 1 (see also FIG. 2D), bit b1 of the 2-bit data stored by FeFET 200 is configured to be read by application of Vg=Vbias to gate region 202, application of Vread to second S/D region 210 and application of Vdnd to first S/D region 208.

In FIG. 2C, waveform 219 represents CBB portions 217(1) and 217(2) for FeFET 200 during quiescent conditions. In waveform 219, CBB portion 217(1) has the first quiescent CBB value, QCBB0, and CBB portion 217(2) has the second quiescent CBB value, QCBB1.

In FIG. 2D, waveform 220 represents CBB portions 217(1) and 217(2) during phase 1 of the two-phase read operation (see FIG. 2B). During phase 1, bit b1 is read, wherein bit b1 is stored at the first end of ferroelectric layer 204, the first end being proximal to first S/D region 208. During phase 1, Vg=Vbias is applied to gate region 202, Vdnd is applied to first S/D region 208 and Vread is applied to second S/D region 210.

In FIG. 2E, waveform 228 represents CBB portions 217(1) and 217(2) during phase 2 of the two-phase read operation. During phase 2, bit b0 is read, wherein bit b0 is stored at the second end of ferroelectric layer 204, the second end being proximal to second S/D region 210. During phase 2, Vg=Vbias is applied to gate region 202, Vdnd is applied to second S/D region 210 and Vread is applied to first S/D region 208.

Regarding FIG. 2D, it shows (again) phase 1 by which bit b1 is read. Recalling that bit b1=0 (see FIG. 2B) because the first end of ferroelectric layer 204 has the first polarization and that bit b0=1 (see FIG. 2A) because the second end of ferroelectric layer 204 has the second polarization, FIG. 2D assumes that Vg=Vbias is being applied to gate region 202, Vdnd=0V is being applied to first S/D region 208 and Vread=−1V is being applied to second S/D region 210.

In the context of FIG. 2D, because of the second polarization at the second end of ferroelectric layer 204, the portion of invertible region 216 proximal to second S/D region 210 supports the flow of charge carriers under quiescent conditions. Accordingly, the portion of invertible region 216 proximal to S/D region 210 also supports the flow of charge carriers when Vg=Vbias is being applied to gate region 202 and Vread=−1V is being applied to second S/D region 210. The voltage difference between Vg and Vdnd (the latter being applied to first S/D region 108) in combination with the first polarization state of the first end of ferroelectric layer 204 is NOT sufficient to overcome the first polarization at the first end of ferroelectric layer 204 and consequently is NOT sufficient to draw charge carriers into the portion of invertible region 216 that is proximal to first S/D region 208, with a result that the portion of invertible region 216 which is proximal to first S/D region 208 does NOT support a flow of charge carriers. As a further result, only the portion of invertible region 216 proximal to second S/D region 210 supports the flow of charge carriers, and consequently no current flows from second S/D region 210 to first S/D region 208 as indicated by reference number 229 in FIG. 2D, which is interpreted as the bit b1 of FeFET 200 storing a logical zero.

Regarding FIG. 2E, it shows (again) phase 2 by which bit b0 of FeFET 200 is read. Recalling that bit b1=0 (see FIG. 2A) because the first end of ferroelectric layer 204 has the first polarization and that bit b0=1 (see FIG. 2A) because the second end of ferroelectric layer 204 has the second polarization, FIG. 2E assumes that Vg=Vbias is being applied to gate region 202, Vread=−1V is being applied to first S/D region 208 and Vdnd=0V is being applied to second S/D region 210.

In the context of FIG. 2E, the voltage difference between Vg and Vread (the latter being applied to first S/D region 208) in combination with the first polarization state of the first end of ferroelectric layer 204 is sufficient to overcome the first polarization at the first end of ferroelectric layer 204 and consequently is sufficient to draw charge carriers into the portion of invertible region 216 that is proximal to first S/D region 208, with a result that the portion of invertible region 216 which is proximal to first S/D region 208 supports temporarily a flow of charge carriers. Because of the second polarization at the second end of ferroelectric layer 204, the portion of invertible region 216 proximal to S/D region 210 supports the flow of charge carriers under quiescent conditions. Accordingly, the portion of invertible region 216 proximal to S/D region 208 also supports the flow of charge carriers when Vg=Vbias is being applied to gate region 202 and Vdnd=0V is being applied to second S/D region 210. As a temporary result, both the portion of invertible region 216 proximal to second S/D region 210 and the portion of invertible region 216 proximal to first S/D region 208 support the flow of charge carriers, and consequently current flows from second S/D region 110 to first S/D region 108 as indicated by reference number 230 in FIG. 2E, which is interpreted as the bit b0 of FeFET 200 storing a logical one.

FIGS. 3A and 3B are corresponding cross-sections of a 2-bit FeFET, in accordance with some embodiments. FIGS. 3C-3E are corresponding waveforms 319, 320 and 328 that represent channel band barrier portions under correspondingly different conditions, in accordance with some embodiments.

FIGS. 3A-3E follow a similar numbering scheme to that of FIGS. 1A-1E. Though some aspects correspond, nevertheless there are some aspects that differ. To help identify aspects which correspond, the numbering convention uses 3-series numbers for FIGS. 3A-3E while FIGS. 1A-1E uses 1-series numbers. For example, item 319 in FIG. 3C is a waveform under quiescent conditions and corresponding item 119 in FIG. 1C is a waveform under quiescent conditions, and wherein: similarities are reflected in the common root _19; and differences are reflected in the corresponding leading digit 3 in FIG. 3C and 1 in FIG. 1C. For brevity, the discussion will focus more on differences between FIGS. 3A-3E and FIGS. 1A-1E than on similarities.

In some embodiments, FeFET 300 includes a semiconductor substrate 306 which includes a source region 308 and a drain region 310. A gate stack 311 is over semiconductor substrate 306 with source region 308 and drain region 310 extending to opposite sides of gate stack 311. Gate stack 311 includes a ferroelectric layer 304 over semiconductor substrate 306 and a gate region 302 over ferroelectric layer 304. First and second ends of ferroelectric layer 304 are proximal correspondingly to first S/D region 308 and second S/D region 310. Dipoles are dispersed throughout ferroelectric layer 304. In particular, ferroelectric layer 304 includes a first set of dipoles 314A at the second end of ferroelectric layer 304, and a second set of dipoles 314B at the first end of ferroelectric layer 304. Invertible region 316 extends through semiconductor substrate 306 between source region 308 and drain region 310 (hereinafter referred to as first S/D region 308 and second S/D region 310.

In FIGS. 3A-3B: bit b1 of the 2-bits of data stored by FeFET 300 is shown as being a logical "0" and so is represented by the first end of ferroelectric layer 304 (which, again, is proximal to first S/D region 308) having the first polarization; and bit b0 of the 2-bits of data stored by FeFET 300 is shown as being a logical "0" and so is represented by the second end of ferroelectric layer 304 (which, again, is proximal to second S/D region 310) having the first polarization. Accordingly, in FIGS. 3A-3B, relative to the X-axis, the polarization of ferroelectric layer 304 is symmetric. More particularly, the polarization of ferroelectric layer 304 is symmetric because the first end of ferroelectric layer 304 (which is proximal to first S/D region 308) has the first polarization and the second end of ferroelectric layer 304 (which is proximal second S/D region 310) has the first polarization.

In FIGS. 3A and 3B, the polarization of the first and second ends of ferroelectric layer 304, which are correspondingly proximal to first S/D region 308 and second S/D region 310, thickens the depletion regions proximal to first S/D region 308 and second S/D region 310 relative to the Y-axis, and correspondingly raises/increases the CBB portions 317(1) and 317(2) proximal correspondingly to first S/D region 308 and second S/D region 310. This raising/increasing of CBB portions 317(1) and 317(2) is discussed in more detail below.

FIG. 3A shows voltages applied during phase 2 of the two-phase process by which bit b0 of the 2-bits of data stored by FeFET 300 is read. FIG. 3B is a version of FIG. 3A which shows voltages applied during phase 1 of the two-phase process by which bit b1 of the 2-bits of data stored by FeFET 300 is read. The two-phase read-process for reading the 2-bit state stored in FeFET 300 is discussed in more detail in the context of FIG. 3D-3E.

In FIG. 3B, the voltages for phase 1 of the two-phase read operation are shown. More particularly, during phase 1 (see also FIG. 3D), bit b1 of the 2-bit data stored by FeFET 300 is configured to be read by application of Vg=Vbias to gate region 302, application of Vread to second S/D region 310 and application of Vdnd to first S/D region 308.

In FIG. 3C, waveform 319 represents CBB portions 317(1) and 317(2) for FeFET 300 during quiescent conditions. In waveform 319, each of CBB portion 317(1) and 317(2) has the first quiescent CBB value, QCBB0.

In FIG. 3D, waveform 320 represents CBB portions 317(1) and 317(2) during phase 1 of the two-phase read operation (see FIG. 3B). During phase 1, bit b1 is read, wherein bit b1 is stored at the first end of ferroelectric layer 304, the first end being proximal to first S/D region 308. During phase 1, Vg=Vbias is applied to gate region 302, Vdnd is applied to first S/D region 308 and Vread is applied to second S/D region 310.

In FIG. 2E, waveform 328 represents CBB portions 317(1) and 317(2) during phase 2 of the two-phase read operation. During phase 2, bit b0 is read, wherein bit b0 is stored at the second end of ferroelectric layer 304, the second end being proximal to second S/D region 310. During phase 2, Vg=Vbias is applied to gate region 302, Vdnd is applied to second S/D region 310 and Vread is applied to first S/D region 308.

Regarding FIG. 3D, it shows (again) phase 1 by which bit b1 is read. Recalling that bit b1=0 (see FIG. 3B) because the first end of ferroelectric layer 304 has the first polarization and that bit b0=0 (see FIG. 3A) because the second end of ferroelectric layer 304 has the first polarization, FIG. 3D assumes that Vg=Vbias is being applied to gate region 302, Vdnd=0V is being applied to first S/D region 308 and Vread=−1V is being applied to second S/D region 310.

In the context of FIG. 3D, the voltage difference between Vg and Vread (the latter being applied to second S/D region 310) in combination with the first polarization state of the second end of ferroelectric layer 304 is sufficient to overcome the first polarization at the second end of ferroelectric layer 304 and consequently is sufficient to draw charge carriers into the portion of invertible region 316 that is proximal to second S/D region 310, with a result that the portion of invertible region 316 which is proximal to second S/D region 310 temporarily supports a flow of charge carriers. However, the voltage difference between Vg and Vdnd (the latter being applied to first S/D region 308) in combination with the first polarization state of the first end of ferroelectric layer 304 is NOT sufficient to overcome the first polarization at the first end of ferroelectric layer 304 and consequently is NOT sufficient to draw charge carriers into the portion of invertible region 316 that is proximal to first S/D region 308, with a result that the portion of invertible region 316 that is proximal to first S/D region 308 does NOT support a flow of charge carriers. As a further result, only the portion of invertible region 316 proximal to second S/D region 310 supports temporarily the flow of charge carriers, and consequently no current flows from second S/D region 310 to first S/D region 308 as indicated by reference number 329 in FIG. 3D, which is interpreted as the bit b1 of FeFET 300 storing a logical zero.

Regarding FIG. 3E, it shows (again) phase 2 by which bit b0 of FeFET 300 is read. Recalling that bit b1=0 (see FIG. 3A) because the first end of ferroelectric layer 304 has the first polarization and that bit b0=0 (see FIG. 3A) because the second end of ferroelectric layer 304 has the first polarization, FIG. 3E assumes that Vg=Vbias is being applied to gate region 302, Vread=−1V is being applied to first S/D region 308 and Vdnd=0V is being applied to second S/D region 310.

In the context of FIG. 3E, the voltage difference between Vg and Vread (the latter being applied to first S/D region 308) in combination with the first polarization state of the first end of ferroelectric layer 304 is sufficient to overcome the first polarization at the first end of ferroelectric layer 304 and consequently is sufficient to draw charge carriers into the portion of invertible region 316 that is proximal to first S/D region 308, with a result that the portion of invertible region 316 which is proximal to first S/D region 308 temporarily supports a flow of charge carriers. However, the voltage difference between Vg and Vdnd (the latter being applied to second S/D region 310) in combination with the first polarization state of the second end of ferroelectric layer 304 is NOT sufficient to overcome the first polarization at the second end of ferroelectric layer 304 and consequently is NOT sufficient to draw charge carriers into the portion of invertible region 316 that is proximal to second S/D region 310, with a result that the portion of invertible region 316 which is proximal to second S/D region 310 does NOT support a flow of charge carriers. As a result, only the portion of invertible region 316 proximal to first S/D region 308 supports temporarily the flow of charge carriers, and consequently no current flows from first S/D region 308 to second S/D region 310 as indicated by reference number 329 in FIG. 3E, which is interpreted as the bit b0 of FeFET 300 storing a logical zero.

FIGS. 4A and 4B are corresponding cross-sections of a 2-bit FeFET, in accordance with some embodiments. FIGS. 4C-4E are corresponding waveforms 419, 420 and 428 that represent channel band barrier portions under correspondingly different conditions, in accordance with some embodiments.

FIGS. 4A-4E follow a similar numbering scheme to that of FIGS. 1A-1E. Though some aspects correspond, nevertheless there are some aspects that differ. To help identify aspects which correspond, the numbering convention uses 4-series numbers for FIGS. 4A-4E while FIGS. 1A-1E uses 1-series numbers. For example, item 419 in FIG. 4C is a waveform under quiescent conditions and corresponding item 119 in FIG. 1C is a waveform under quiescent conditions, and wherein: similarities are reflected in the common root _19; and differences are reflected in the corresponding leading digit 4 in FIG. 4C and 1 in FIG. 1C. For brevity, the discussion will focus more on differences between FIGS. 4A-4E and FIGS. 1A-1E than on similarities.

In some embodiments, FeFET 400 includes a semiconductor substrate 406 which includes a source region 408 and a drain region 410. A gate stack 411 is over semiconductor substrate 406 with source region 408 and drain region 410 extending to opposite sides of gate stack 411. Gate stack 411 includes a ferroelectric layer 404 over semiconductor substrate 406 and a gate region 402 over ferroelectric layer 404. First and second ends of ferroelectric layer 404 are proximal correspondingly to first S/D region 408 and second S/D region 410. Dipoles are dispersed throughout ferroelectric layer 404. In particular, ferroelectric layer 404 includes a first set of dipoles 414A at the second end of ferroelectric layer 404, and a second set of dipoles 414B at the first end of ferroelectric layer 404. Invertible region 416 extends through semiconductor substrate 406 between source region 408 and drain region 410 (hereinafter referred to as first source/drain (S/D) region 408 and second S/D region 410).

In FIGS. 4A-4B: bit b1 of the 2-bits of data stored by FeFET 400 is shown as being a logical "1" and so is represented by the first end of ferroelectric layer 404 (which, again, is proximal to first S/D region 408) having the second polarization; and bit b0 of the 2-bits of data stored by FeFET 400 is shown as being a logical "1" and so is represented by the second end of ferroelectric layer 404 (which, again, is proximal to second S/D region 410) having the second polarization. Accordingly, in FIGS. 4A-4B, relative to the X-axis, the polarization of ferroelectric layer 404 is symmetric. More particularly, the polarization of ferroelectric layer 404 is symmetric because the first end of ferroelectric layer 404 (which is proximal to first S/D region 408) has the second polarization and the second end of ferroelectric layer 404 (which is proximal second S/D region 410) has the second polarization.

In FIGS. 4A and 4B, the polarization of the first and second ends of ferroelectric layer 404, which are correspondingly proximal to first S/D region 408 and second S/D region 410, thin the depletion regions proximal to first S/D region 408 and second S/D region 410 relative to the Y-axis, and correspondingly lowers/decreases the CBB portions 417(1) and 417(2) proximal correspondingly to first S/D region 408 and second S/D region 410. This lowering/decreasing of CBB portions 417(1) and 417(2) is discussed in more detail below.

FIG. 4A shows voltages applied during phase 2 of the two-phase process by which bit b0 of the 2-bits of data stored by FeFET 400 is read. FIG. 4B is a version of FIG. 4A which shows voltages applied during a phase 1 of the two-phase process by which bit b1 of the 2-bits of data stored by FeFET 400 is read. The two-phase process by which the 2-bit state stored in FeFET 400 is discussed in more detail in the context of FIGS. 4C-4E.

In FIG. 4B, the voltages for phase 1 of the two-phase read operation are shown. More particularly, during phase 1 (see also FIG. 4D), bit b1 of the 2-bit data stored by FeFET 400 is configured to be read by application of Vg=Vbias to gate region 402, application of Vread to second S/D region 410 and application of Vdnd to first S/D region 408.

In FIG. 4C, waveform 419 represents CBB portions 417(1) and 417(2) for FeFET 400 during quiescent conditions. In waveform 419, each of CBB portions 417(1) and 417(2) for FeFET 400 has the second quiescent CBB, QCBB1.

In FIG. 4D, waveform 420 represents CBB portions 417(1) and 417(2) during phase 1 of the two-phase read operation. During phase 1, bit b1 is read, wherein bit b1 is stored at the first end of ferroelectric layer 404, the first end being proximal to first S/D region 408. During phase 1, Vg=Vbias is applied to gate region 302, Vdnd is applied to first S/D region 408 and Vread is applied to second S/D region 410.

In FIG. 4E, waveform 428 represents CBB portions 417(1) and 417(2) during phase 2 of the two-phase read operation. During phase 2, bit b0 is read, wherein bit b0 is stored at the second end of ferroelectric layer 404, the second end being proximal to second S/D region 410. During phase 2, Vdnd is applied to second S/D region 410 and Vread is applied to first S/D region 408.

Regarding FIG. 4D, it shows (again) phase 1 by which bit b1 is read. Recalling that bit b1=1 (see FIG. 4B) because the first end of ferroelectric layer 404 has the second polarization and that bit b0=1 (see FIG. 4B) because the second end of ferroelectric layer 404 has the second polarization, FIG. 4D assumes that Vg=Vbias is being applied to gate region 402, Vdnd=0V is being applied to first S/D region 408 and Vread=−1V is being applied to second S/D region 410.

In the context of FIG. 4D, because of the second polarization at the second end of ferroelectric layer 404, the portion of invertible region 416 proximal to second S/D region 410 supports the flow of charge carriers under quiescent conditions. Accordingly, the portion of invertible region 416 proximal to second S/D region 410 also supports the flow of charge carriers when Vg=Vbias is being applied to gate region 402 and Vread=−1V is being applied to second S/D region 410. Furthermore, because of the second polarization at the first end of ferroelectric layer 404, the portion of invertible region 416 proximal to first S/D region 408 supports the flow of charge carriers under quiescent conditions. Accordingly, the portion of invertible region 416 proximal to first S/D region 408 also supports the flow of charge carriers when Vg=Vbias is being applied to gate region 402 and Vdnd=0V is being applied to first S/D region 408. As a result, both the portion of invertible region 416 proximal to first S/D region 408 and the portion of invertible region 416 proximal to second S/D region 410 support the flow of charge carriers, and consequently current flows from second S/D region 410 to first S/D region 408 as indicated by reference number 430 in FIG. 4D, which is interpreted as the bit b1 of FeFET 400 storing a logical one.

Regarding FIG. 4E, it shows (again) phase 2 by which bit b0 of FeFET 400 is read. Recalling that bit b1=1 (see FIG. 4A) because the first end of ferroelectric layer 404 has the second polarization and that bit b0=1 (see FIG. 4A) because the second end of ferroelectric layer 404 has the second polarization, FIG. 4E assumes that Vg=Vbias is being applied to gate region 402, Vread=−1V is being applied to first S/D region 408 and Vdnd=0V is being applied to second S/D region 410.

In the context of FIG. 4E, because of the second polarization at the first end of ferroelectric layer 404, the portion of invertible region 416 proximal to first S/D region 408 supports the flow of charge carriers under quiescent conditions. Accordingly, the portion of invertible region 416 proximal to first S/D region 408 also supports the flow of charge carriers when Vg=Vbias is being applied to gate region 402 and Vread=−1V is being applied to first S/D region 408. Furthermore, because of the second polarization at the second end of ferroelectric layer 404, the portion of invertible region 416 proximal to second S/D region 410 also supports the flow of charge carriers under quiescent conditions. Accordingly, the portion of invertible region 416 proximal to second S/D region 408 also supports the flow of charge carriers when Vg=Vbias is being applied to gate region 402 and Vdnd=0V is being applied to second S/D region 410. As a result, both the portion of invertible region 416 proximal to second S/D region 410 and the portion of invertible region 416 proximal to first S/D region 408 support the flow of charge carriers, and consequently current flows from first S/D region 408 to second S/D region 410 as indicated by reference number 430 in FIG. 4E, which is interpreted as the bit b1 of FeFET 400 storing a logical one.

Figure 5B:
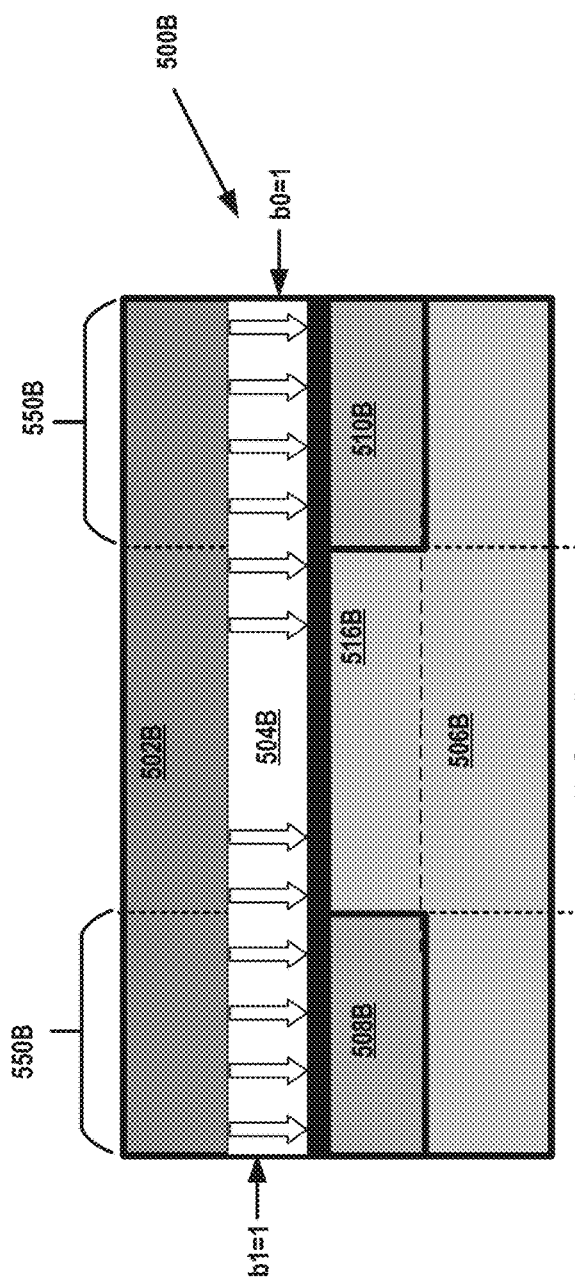

In some embodiments, FIGS. 5A and 5B are corresponding cross-sections of a 2-bit FeFET, memory in accordance with some embodiments.

FIGS. 5A-5B follow a similar numbering scheme to that of FIGS. 1A-1E. Though some aspects correspond, nevertheless there are some aspects that differ. To help identify aspects which correspond, the numbering convention uses 5-series numbers for FIGS. 5A-5B while FIGS. 1A-1E uses 1-series numbers. For example, item 508A in FIG. 5A is a first S/D region, corresponding item 508B in FIG. 5B is a first S/D region and corresponding item 108 in FIG. 1A is a first S/D region, and wherein: similarities are reflected in the common root _08; and differences are reflected in the corresponding leading digit 5 in FIGS. 5A-5B and 1 in FIG. 1A, and further differences are noted in the suffixes "A" in FIG. 5A and "B" in FIG. 5B. For brevity, the discussion will focus more on differences between FIGS. 5A-5B and FIGS. 1A-1E than on similarities.

In some embodiments, each of FeFETs 500A and 500B includes a semiconductor substrate 506A and 506B which includes a source region 508A and 508B and a drain region 510A and 510B. A ferroelectric layer 504A and 504B is over semiconductor substrate 506A and 506B and a gate region 502A and 502B is over ferroelectric layers 504A and 504B. First and second ends of ferroelectric layer 504A and 504B are proximal to corresponding first S/D regions 508A and 508B and corresponding second S/D regions 510A and 510B.

In some embodiments, memory structures 500A and 500B have gate regions 502A and 502B and ferroelectric layers 504A and 504B that extend correspondingly over S/D regions 508A, 508B, 510A and 510B and create correspondingly overlap zones 550A and 550B. By contrast, there is substantially no overlap between gate region 102 and corresponding S/D regions 108 and 110 of FIG. 1A.

Relative to the X-axis, and assuming that widths of S/D regions 508A and 510A and invertible region 516A are substantially the same as corresponding S/D regions 108 and 110 and invertible region 116, overlap zones 550A increase the widths of gate region 502A and ferroelectric layer 504A as compared correspondingly to gate region 102 and ferroelectric layer 104 of FIG. 1A. In some embodiments, depending upon whether the first and second ends of ferroelectric layer 504A correspondingly have the first or second polarizations, overlap zones 550A create correspondingly greater or smaller values of the channel band barrier for portions of invertible region 516A proximal correspondingly to S/D regions 508A and 510A as compared to corresponding circumstances for FIG. 1A.

Relative to the X-axis, and assuming that widths of S/D regions 508B and 510B and invertible region 516B are substantially the same as corresponding S/D regions 508A and 510A and invertible region 516, overlap zones 550B increase the widths of gate region 502B and ferroelectric layer 504B as compared correspondingly to gate region 502A and ferroelectric layer 504A of FIG. 5A. In some embodiments, depending upon whether the first and second ends of ferroelectric layer 504B correspondingly have the first or second polarizations, overlap zones 550B create correspondingly greater or smaller values of the channel band barrier for portions of invertible region 516B proximal correspondingly to S/D regions 508B and 510B as compared to corresponding circumstances for FIG. 5A.

Figure 6A:
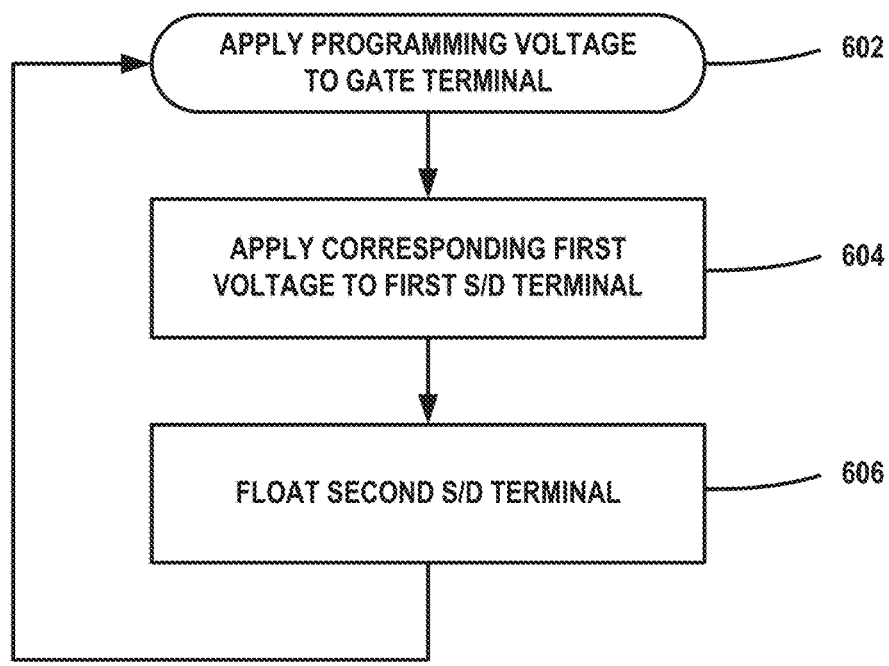
FIG. 6A is a flow diagram for writing to a FeFET, in accordance with some embodiments.

FIG. 6A is a flow diagram for writing to a FeFET, in accordance with some embodiments.

In some embodiments, a process of writing to a FeFET configured as a 2-bit storage device, the FeFET having a first source/drain (S/D) terminal, a second S/D terminal, and a gate terminal and a ferroelectric layer, includes writing asymmetrically to the 2-bit storage device, i.e., writing to a first bit of the two bits while not disturbing a second bit of the two bits, or conversely writing to the second bit of the two bits while not disturbing the first bit of the two bits, and hereinafter is referred to as an asymmetric writing process.

The asymmetric writing process of FIG. 6A includes blocks 602-606. For simplicity of illustration, blocks 604-606 assume that the first bit of the two bits is being written while the second bit of the two bits is not being disturbed. Examples are mentioned below in the discussion of blocks 602-606; the examples assume that the FeFET is an N-type FeFET.

At block 602, a programming voltage is applied to the gate terminal. Examples of the gate terminal include gate terminals 102, 202, 302, 402, 502A, 502B, or the like. More particularly, to set a bit to a logical 1 value in a memory structure, i.e., to program the bit, an appropriate gate voltage (Vg) is applied to the gate terminal. An example value of the programming voltage used to program a bit is Vg=3V (see discussion of FIG. 1A). From block 602, flow proceeds to block 604.

At block 604, a corresponding first voltage is applied to the first S/D terminal, wherein the first voltage is lower than the programming voltage. In some embodiments, a positive voltage bias Vs/d is applied to the first S/D region in order to set a logical 1 value. For example, assuming a coercive voltage Vc=3V (see discussion of FIG. 1A), and further assuming that Vg=3V, Vs/d is set to 0V in order to create a voltage difference between the gate terminal and the first S/D terminal which is equal to (or greater than) the coercive voltage Vc of 3V, and thus the voltage difference is sufficient to orient the dipoles of the ferroelectric layer to have the second polarization (see discussion of FIG. 1A). Examples of the ferroelectric layer include ferroelectric layers 104, 204, 304, 404, 504A, 504B, or the like. An example of an S/D terminal programmed to a logical 1 value is first S/D region 108, second S/D region 210, first S/D region 408, second S/D region 410, first S/D region 510A, second S/D region 510, first S/D region 508B, second S/D region 510B, or the like. From block 604, flow proceeds to block 606.

At block 606, the second S/D terminal is left floating. In some embodiments, substantially zero volts is applied to the second S/D terminal in order to create a voltage difference between the gate terminal and the second S/D terminal which is significantly less than the coercive voltage Vc, Vc=3V, and thus the voltage difference is not sufficient to orient the dipoles of the ferroelectric layer to have the second polarization. As a result, the polarization of the second S/D terminal is unaffected.

As noted, blocks 604-606 assume that the first bit of the two bits is being written while the second bit of the two bits is not being disturbed. Performing the converse, namely writing to the second bit of the two bits while not disturbing the first bit of the two bits, includes the following: at block 604, the first voltage is applied to the second S/D terminal rather than the first S/D terminal; and, at block 606, the first S/D terminal is left floating rather than the second S/D terminal.

Figure 6B:
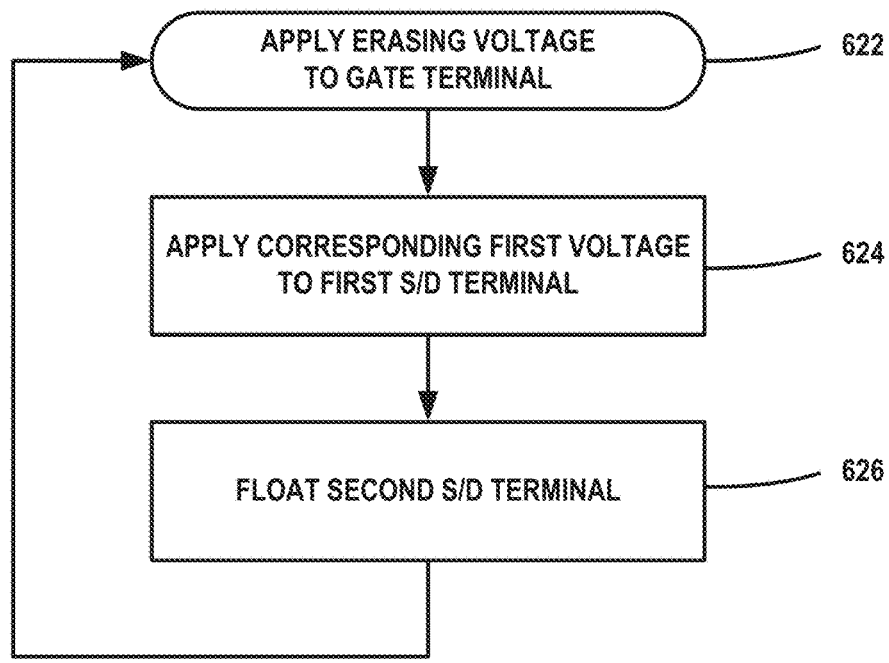
FIG. 6B is a flow diagram for erasing a FeFET, in accordance with some embodiments.

FIG. 6B is a flow diagram for erasing a FeFET, in accordance with some embodiments.

In some embodiments, a process of erasing a FeFET configured as a 2-bit storage device, the FeFET having a first source/drain (S/D) terminal, a second S/D terminal, and a gate terminal, includes asymmetrically erasing the 2-bit storage device, i.e., erasing a first bit of the two bits while not disturbing a second bit of the two bits, or conversely erasing the second bit of the two bits while not disturbing the first bit of the two bits, and hereinafter is referred to as an asymmetric erasing process.

The asymmetric erasing process of FIG. 6B includes blocks 622-626. For simplicity of illustration, blocks 624-626 assume that the first bit of the two bits is being erased while the second bit of the two bits is not being disturbed. Examples are mentioned below in the discussion of blocks 622-626; the examples assume that the FeFET is an N-type FeFET.

At block 622, an erasing voltage is applied to the gate terminal. Examples of the gate terminal include gate terminals 102, 202, 302, 402, 502A, 502B, or the like. More particularly, to set a bit to a logical 0 value in a memory structure, i.e., to erase the bit, an appropriate gate voltage (Vg) is applied to the gate terminal. An example value of the erasing voltage used to erase a bit is Vg=-2V (see discussion of FIG. 1A). From block 622, flow proceeds to block 624.

At block 624, a corresponding first voltage is applied to the first S/D terminal, wherein the first voltage is higher than the erasing voltage. In some embodiments, a positive voltage bias Vs/d is applied to the first S/D region in order to set a logical 1 value. For example, assuming a coercive voltage Vc=3V (see discussion of FIG. 1A), and further assuming that Vg=-2V, Vs/d is set to 1V in order to create a voltage difference between the gate terminal and the first S/D terminal which is equal to (or greater than) the coercive voltage Vc of 3V, and thus the voltage difference is sufficient to orient the dipoles of the ferroelectric layer to have the first polarization (see discussion of FIG. 1A). Examples of the ferroelectric layer include ferroelectric layers 104, 204, 304, 404, 504A, 504B, or the like. An example of an S/D terminal programmed to a logical 0 value is second S/D region 110, first S/D region 208, first S/D region 308, second S/D region 310, or the like. From block 624, flow proceeds to block 626.

At block 626, the second S/D terminal is left floating. In some embodiments, substantially zero volts is applied to the second S/D terminal in order to create a voltage difference between the gate terminal and the second S/D terminal which is significantly less than the coercive voltage Vc, Vc=3V, and thus the voltage difference is not sufficient to orient the dipoles of the ferroelectric layer to have the first polarization. As a result, the polarization of the second S/D terminal is unaffected.

As noted, blocks 624-626 assume that the first bit of the two bits is being erased while the second bit of the two bits is not being disturbed. Performing the converse, namely erasing the second bit of the two bits while not disturbing the first bit of the two bits, includes the following: at block 624, the first voltage is applied to the second S/D terminal rather than the first S/D terminal; and, at block 666, the first S/D terminal is left floating rather than the second S/D terminal.

Figure 7:
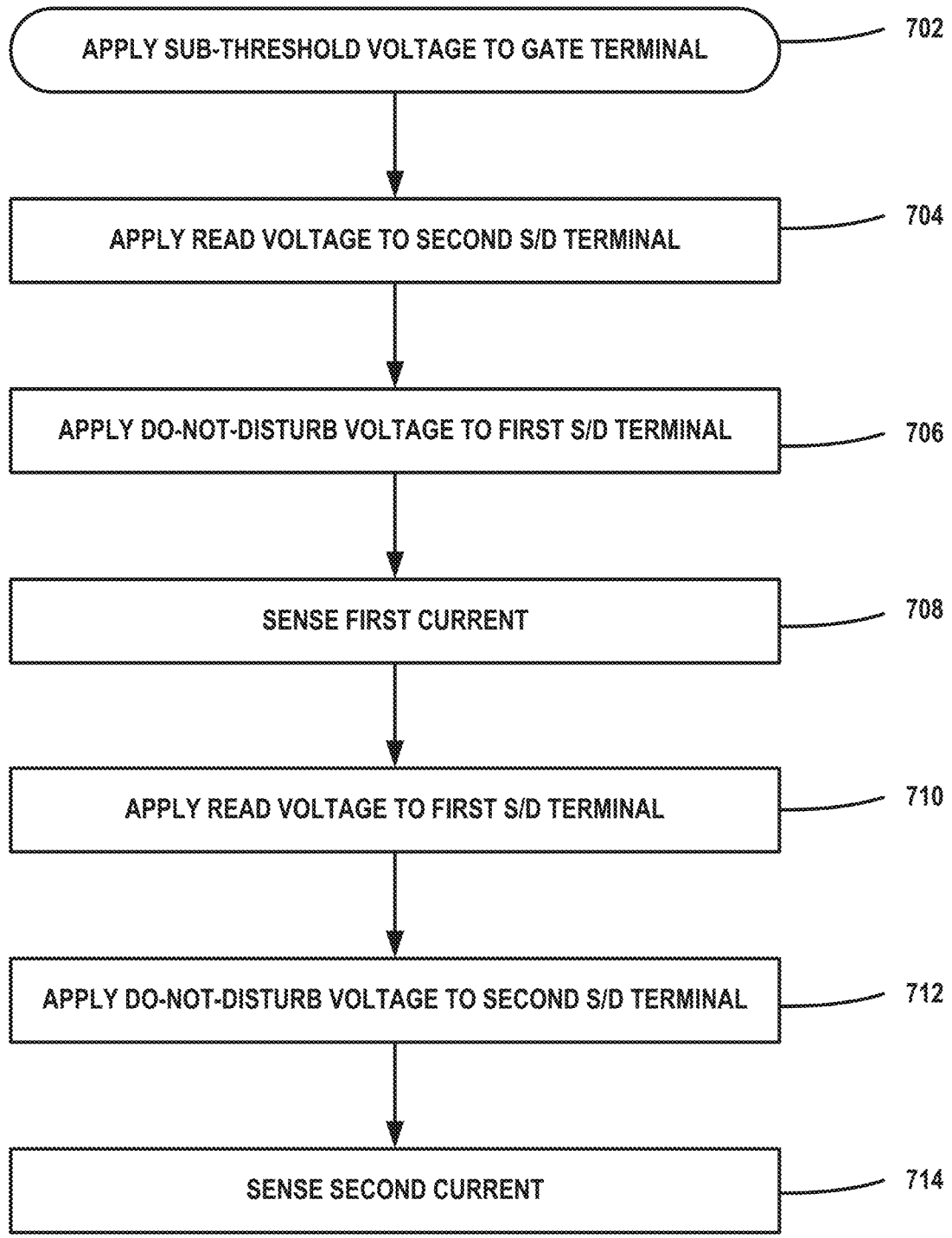
FIG. 7 is a flow diagram for reading a FeFET, in accordance with some embodiments.

FIG. 7 is flow diagram of a reading a FeFET configured as a 2-bit storage device, in accordance with some embodiments.

In some embodiments, a process of reading a FeFET configured as a 2-bit storage device, the FeFET including a first source/drain (S/D) terminal, a second S/D terminal, a gate terminal and a ferroelectric layer, includes applying asymmetric voltages correspondingly to the first and second S/D regions, and hereinafter is referred to as an asymmetric reading process.

The asymmetric reading process of FIG. 7 includes blocks 702-714. Examples are mentioned below in the discussion of blocks 702-714; the examples assume that the FeFET is an N-type FeFET. In general, blocks 702-708 read the second bit, b1 of the pair (b1,b0), stored at the first end of the ferroelectric layer, the first end being proximal to the first S/D region. In general, blocks 702 and 710-714 read the first bit, b0 of the pair (b1,b0), stored at the second end of the ferroelectric layer, the second end being proximal to the second S/D region.

At block 702, a sub-threshold value of a gate voltage, Vg, is applied to the gate terminal. Examples of the gate terminal include gate terminals 102, 202, 302, 402, 502A, 502B, or the like. As discussed in the context of FIGS. 1D-1E, or the like, an example of the sub-threshold voltage applied to the gate terminal is Vg=1V. From block 702, flow proceeds to block 704.

At block 704, a read voltage is applied to the second S/D terminal. The read voltage applied to the second S/D terminal is lower than the sub-threshold voltage applied to the gate terminal. As discussed in the context of FIGS. 1D-1E, or the like, an example of the read voltage is Vread=−1V. From block 704, flow proceeds to block 706.

At block 706, a do-not-disturb voltage, Vdnd, is applied to the first S/D terminal. As discussed in the context of FIGS. 1D-1E, or the like, an example of Vdnd is Vdnd=0V. From block 706, flow proceeds to block 708.

At block 708, a first current is sensed. As discussed in the context of FIGS. 1D, 4D, or the like, if the second bit, b1 of the pair (b1,b0), is a logical 1 value, then a significant non-zero current is sensed at the second S/D terminal. That is, if a significant non-zero current is sensed, then b1 is inferred to have a logical 1 value. By contrast, as discussed in the context of FIG. 2D, 3D, or the like, if the second bit, b1 of the pair (b1,b0), is a logical 0 value, then substantially zero current is sensed at the second S/D terminal. That is, if substantially no current is sensed, then b1 is inferred to have a logical 0 value. From block 708, flow proceeds to block 710.

At block 710, the read voltage is applied to the first S/D terminal. It is to be understood that the sub-threshold voltage continues to be applied to the gate terminal in blocks 710-712. From block 710, flow proceeds to block 712.

At block 712, the do-not-disturb voltage, Vdnd, is applied to the second S/D terminal. From block 712, flow proceeds to block 708.

At block 714, a second current is sensed. As discussed in the context of FIG. 2E, 4E, or the like, if the first bit, b0 of the pair (b1,b0), is a logical 1 value, then a significant non-zero current is sensed at the first S/D terminal. That is, if a significant non-zero current is sensed, then b0 is inferred to have a logical 1 value. By contrast, as discussed in the context of FIGS. 1E, 3E, or the like, if the second bit, b0 of the pair (b1,b0), is a logical 0 value, then substantially zero current is sensed at the first S/D terminal. That is, if substantially no current is sensed, then b0 is inferred to have a logical 0 value.

In some embodiments, a 2-bit state of (0,0) is inferred when each of the first and the second current is substantially zero. In some embodiments, a 2-bit state of (0,1) is inferred when the first current is substantially zero and the second current is a significant non-zero value. In some embodiments, a 2-bit state of (1,0) is inferred when the second current is substantially zero and the first current is a significant non-zero value. In some embodiments, a 2-bit state of (1,1) is inferred when each of the first and the second current is a significant non-zero value.

In some embodiments, a method of reading a ferroelectric field-effect transistor (FeFET) (configured as a 2-bit storage device that stores two bits, the 2-bit storage device including a first source/drain (S/D) terminal, a second S/D terminal, a gate terminal and a ferroelectric layer, the second bit being stored at a first end of the ferroelectric layer, the first end being proximal to the first S/D terminal) includes reading the second bit including applying a gate sub-threshold voltage to the gate terminal; applying a read voltage to the second S/D terminal; applying a do-not-disturb voltage to the first S/D terminal; sensing a first current at the second S/D terminal; and wherein the read voltage is lower than the do-not-disturb voltage.

In some embodiments, the do-not-disturb voltage is lower than the gate sub-threshold voltage.

In some embodiments, the method further includes reading a first bit of the two bits, the first bit being stored at a second end of the ferroelectric layer, the second end being proximal to the second S/D terminal, the reading a first bit including applying the gate sub-threshold voltage to the gate terminal; applying the read voltage to the first S/D terminal; applying the do-not-disturb voltage to the second S/D terminal; and sensing a second current at the first S/D terminal.

In some embodiments, the method further includes inferring a 2-bit state of (0,0) when each of the first and the second current is substantially zero.

In some embodiments, the method further includes inferring a 2-bit state of (0,1) when the first current is substantially zero and the second current is a significant non-zero value.

In some embodiments, the method further includes inferring a 2-bit state of (1,0) when the second current is substantially zero and the first current is a significant non-zero value.

In some embodiments, the method further includes inferring a 2-bit state of (1,1) when each of the first and the second current is correspondingly a significant non-zero value.

In some embodiments, the read voltage applied to the second S/D terminal is approximately −1V.

In some embodiments, the gate sub-threshold voltage applied to the gate terminal is approximately 1V.

In some embodiments, the do-not-disturb voltage applied to the first S/D terminal is approximately 0V.

In some embodiments, a method of writing to a ferroelectric field-effect transistor (FeFET) (configured as a 2-bit storage device that stores two bits, wherein the FeFET includes a first source/drain (S/D) terminal, a second S/D terminal, a gate terminal and a ferroelectric layer, a second bit being at a first end of the ferroelectric layer, the first end being proximal to the first S/D terminal) includes setting the second bit to a logical 1 value, the setting the second bit including applying a gate voltage to the gate terminal; and applying a first source/drain voltage to the second S/D terminal; and wherein the first source/drain voltage is lower than the gate voltage.

In some embodiments, the method further includes applying a second source/drain voltage to the first S/D terminal, and wherein the first source/drain voltage is substantially the same as the second source/drain voltage.

In some embodiments, the gate voltage applied to the gate terminal is approximately 3V; the first source/drain voltage applied to the second S/D terminal is approximately 0V; and the second source/drain voltage applied to the first S/D terminal is approximately 1V.

In some embodiments, the method further includes floating the first S/D terminal.

In some embodiments, the method further includes setting a first bit of the two bits to a logical 1 value, the first bit being stored at a second end of the ferroelectric layer, the second end being proximal to the second S/D terminal, the setting a first bit including applying the gate voltage to the gate terminal; and applying the first source/drain voltage to the first S/D terminal.

In some embodiments, a method of erasing a ferroelectric field-effect transistor (FeFET) (configured as a 2-bit storage device that stores two bits, wherein the FeFET includes a first source/drain (S/D) terminal, a second S/D terminal, a gate terminal and a ferroelectric layer, a second bit being at a first end of the ferroelectric layer, the first end being proximal to the first S/D terminal) includes setting the second bit to a logical 0 value, the setting the second bit including applying a gate voltage to the gate terminal; and applying a first source/drain voltage to the second S/D terminal; wherein the gate voltage is lower than the first source/drain voltage.

In some embodiments, the method further includes applying a second source/drain voltage to the first S/D terminal, wherein the second source/drain voltage is lower than the first source/drain voltage.

In some embodiments, the gate voltage applied to the gate terminal is approximately −2V; the first source/drain voltage applied to the second S/D terminal is approximately 1V; and the second source/drain voltage applied to the first S/D terminal is approximately 0V.

In some embodiments, the method further includes floating a voltage at the first S/D terminal.

In some embodiments, the method further includes setting a first bit of the two bits to a logical 0 value, the first bit being stored at a second end of the ferroelectric layer, the second end being proximal to the second S/D terminal, the setting a first bit including applying the gate voltage to the gate terminal; and applying the first source/drain voltage to the first S/D terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of reading a ferroelectric field-effect transistor (FeFET) configured as a 2-bit storage device that stores two bits, wherein the FeFET includes a first source/drain (S/D) terminal, a second S/D terminal, a gate terminal and a ferroelectric layer, a second bit being at a first end of the ferroelectric layer, the first end being proximal to the first S/D terminal, the method comprising:
    reading the second bit including:
        applying a gate sub-threshold voltage to the gate terminal;
        applying a read voltage to the second S/D terminal;
        applying a do-not-disturb voltage to the first S/D terminal;
        sensing a first current at the second S/D terminal; and
    wherein the read voltage is lower than the do-not-disturb voltage.

2. The method of claim 1, wherein:
    the do-not-disturb voltage is lower than the gate sub-threshold voltage.

3. The method of claim 1, further comprising:
    reading a first bit of the two bits, the first bit being stored at a second end of the ferroelectric layer, the second end being proximal to the second S/D terminal, the reading a first bit including:
        applying the gate sub-threshold voltage to the gate terminal;
        applying the read voltage to the first S/D terminal;
        applying the do-not-disturb voltage to the second S/D terminal; and
        sensing a second current at the first S/D terminal.

4. The method of claim 3, further comprising:
    inferring a 2-bit state of (0,0) when each of the first and the second current is substantially zero.

5. The method of claim 3, further comprising:
    inferring a 2-bit state of (0,1) when the first current is substantially zero and the second current is a significant non-zero value.

6. The method of claim 3, further comprising:
    inferring a 2-bit state of (1,0) when the second current is substantially zero and the first current is a significant non-zero value.

7. The method of claim 3, further comprising:
    inferring a 2-bit state of (1,1) when each of the first and the second current is correspondingly a significant non-zero value.

8. The method of claim 1, wherein:
    the read voltage applied to the second S/D terminal is approximately −1V.

9. The method of claim 1, wherein:
    the gate sub-threshold voltage applied to the gate terminal is approximately 1V.

10. The method of claim 1, wherein:
    the do-not-disturb voltage applied to the first S/D terminal is approximately 0V.

11. A method of reading a ferroelectric field-effect transistor (FeFET) configured as a 2-bit storage device that stores two bits, wherein the FeFET includes a first source/drain (S/D) terminal, a second S/D terminal, a gate terminal and a ferroelectric layer, a second bit being at a first end of the ferroelectric layer, the first end being proximal to the first S/D terminal, the method comprising:
    reading a second bit of the two bits including:
        applying a gate sub-threshold voltage to the gate terminal;
        applying a read voltage to the second S/D terminal;
        applying a do-not-disturb voltage to the first S/D terminal;
        sensing a first current at the second S/D terminal; and
    wherein the read voltage is lower than the do-not-disturb voltage; and reading a first bit of the two bits, the first bit being stored at a second end of the ferroelectric layer, the second end being proximal to the second S/D terminal, the reading a first bit including:
  applying the gate sub-threshold voltage to the gate terminal;
  applying the read voltage to the first S/D terminal;
  applying the do-not-disturb voltage to the second S/D terminal; and
  sensing a second current at the first S/D terminal.

12. The method of claim 11, further comprising:
inferring a 2-bit state of (0,0) when each of the first and the second current is substantially zero.

13. The method of claim 11, further comprising:
inferring a 2-bit state of (0,1) when the first current is substantially zero and the second current is a significant non-zero value.

14. The method of claim 11, further comprising:
inferring a 2-bit state of (1,0) when the second current is substantially zero and the first current is a significant non-zero value.

15. The method of claim 11, further comprising:
inferring a 2-bit state of (1,1) when each of the first and the second current is correspondingly a significant non-zero value.

16. The method of claim 1, wherein:
the do-not-disturb voltage is lower than the gate sub-threshold voltage.

17. A method of reading a ferroelectric field-effect transistor (FeFET) configured as a 2-bit storage device that stores two bits, wherein the FeFET includes a first source/drain (S/D) terminal, a second S/D terminal, a gate terminal and a ferroelectric layer, a second bit being at a first end of the ferroelectric layer, the first end being proximal to the first S/D terminal, the method comprising:
reading the second bit including:
  applying a gate sub-threshold voltage to the gate terminal;
  applying a read voltage to the second S/D terminal;
  applying a do-not-disturb voltage to the first S/D terminal, the do-not-disturb voltage being lower than the gate sub-threshold voltage;
  sensing a first current at the second S/D terminal; and
wherein the read voltage is lower than the do-not-disturb voltage.

18. The method of claim 16, wherein:
the read voltage applied to the second S/D terminal is approximately −1V.

19. The method of claim 16, wherein:
the gate sub-threshold voltage applied to the gate terminal is approximately 1V.

20. The method of claim 16, wherein:
the do-not-disturb voltage applied to the first S/D terminal is approximately 0V.

* * * * *